United States Patent
Chung et al.

(10) Patent No.: US 10,127,993 B2
(45) Date of Patent: Nov. 13, 2018

(54) DIELECTRIC FUSE MEMORY CIRCUIT AND OPERATION METHOD THEREOF

(71) Applicant: NATIONAL CHIAO TUNG UNIVERSITY, Hsinchu (TW)

(72) Inventors: Steve S. Chung, Hsinchu (TW); E-Ray Hsieh, Kaohsiung (TW); Zhi-Hong Huang, Tainan (TW)

(73) Assignee: NATIONAL CHIAO TUNG UNIVERSITY, Hsinchu (TW)

( * ) Notice: Subject to any disclaimer, the term of this patent is extended or adjusted under 35 U.S.C. 154(b) by 0 days.

(21) Appl. No.: 15/222,983

(22) Filed: Jul. 29, 2016

(65) Prior Publication Data

US 2017/0032848 A1 Feb. 2, 2017

Related U.S. Application Data

(60) Provisional application No. 62/198,666, filed on Jul. 29, 2015.

(51) Int. Cl.
*G11C 17/18* (2006.01)
*H01L 27/112* (2006.01)
(Continued)

(52) U.S. Cl.
CPC .............. *G11C 17/18* (2013.01); *G11C 17/16* (2013.01); *H01L 27/11206* (2013.01); *G11C 16/0433* (2013.01); *H01L 23/5256* (2013.01)

(58) Field of Classification Search
CPC ..... G11C 17/18; G11C 17/16; G11C 16/0433; H01L 27/11206; H01L 23/5256
See application file for complete search history.

(56) References Cited

U.S. PATENT DOCUMENTS

| 4,322,822 A | 3/1982 | McPherson |
| 4,507,757 A | 3/1985 | McElroy |

(Continued)

FOREIGN PATENT DOCUMENTS

| CN | 1627526 A | 6/2005 |
| CN | 101197370 A | 6/2008 |

(Continued)

OTHER PUBLICATIONS

Hsieh, E. R. et al. The Demonstration of Low-cost and Logic Process Fully-Compatible OTP Memory on Advanced HKMG CMOS with a Newly found Dielectric Fuse Breakdown. Electron Devices Meeting (IEDM), 2015 IEEE International. Dec. 7-9, 2015.*

(Continued)

*Primary Examiner* — Richard Elms
*Assistant Examiner* — Jerome Leboeuf
(74) *Attorney, Agent, or Firm* — CKC & Partners Co., Ltd.

(57) ABSTRACT

One time programming and repeatably random read integrated circuit memory has a storage device that programs the information by using dielectric-fuse mechanism. The main characteristics of dielectric fuse mechanisms is that by applying an electric field on the dielectrics, the ions or atoms in the dielectrics are drifted-out, or the dielectrics are burned-out, that create damage of the dielectric structure in a form of porosity, and the conductivity (resistivity) of tunneling current through the dielectrics changes the state from high conductivity (resistivity) to low conductivity (resistivity). The dielectric fuse mechanism has been integrated in VLSI circuits, completed the validation, and implemented by the fabrication of CMOS process.

30 Claims, 19 Drawing Sheets

(51) Int. Cl.
  *G11C 17/16* (2006.01)
  *H01L 23/525* (2006.01)
  *G11C 16/04* (2006.01)

(56) References Cited

U.S. PATENT DOCUMENTS

| | | | |
|---|---|---|---|
| 4,543,594 | A | 9/1985 | Mohsen et al. |
| 4,823,181 | A | 4/1989 | Mohsen et al. |
| 4,899,205 | A | 2/1990 | Hamdy et al. |
| 5,646,438 | A | 7/1997 | Frerichs |
| 5,909,049 | A | 6/1999 | McCollum |
| 5,986,939 | A | 11/1999 | Yamada |
| 6,087,707 | A | 7/2000 | Lee et al. |
| 6,249,472 | B1 | 6/2001 | Tamura et al. |
| 6,282,123 | B1 | 8/2001 | Mehta |
| 6,421,293 | B1 | 7/2002 | Candelier et al. |
| 6,630,724 | B1 | 10/2003 | Marr |
| 6,711,064 | B2 | 3/2004 | Hsu et al. |
| 6,914,825 | B2 | 7/2005 | Hau et al. |
| 7,209,392 | B2 | 4/2007 | Chen et al. |
| 7,529,148 | B2 | 5/2009 | Shah et al. |
| 7,576,593 | B2 | 8/2009 | Chang et al. |
| 8,174,063 | B2 | 5/2012 | Lu et al. |
| 8,344,445 | B2 | 1/2013 | Lu et al. |
| 8,625,324 | B2 | 1/2014 | Lin et al. |
| 8,705,263 | B2 | 4/2014 | Liu |
| 8,837,219 | B2 | 9/2014 | Hsiao et al. |
| 8,848,423 | B2 | 9/2014 | Chung |
| 9,613,714 | B1 * | 4/2017 | Wong ............... G11C 17/16 |
| 2008/0006902 | A1 | 1/2008 | Carney et al. |
| 2009/0184350 | A1 * | 7/2009 | Kodama ............ G11C 17/16 257/296 |
| 2009/0250726 | A1 | 10/2009 | Kurjanowicz |
| 2010/0006924 | A1 | 1/2010 | Chen et al. |
| 2010/0035397 | A1 | 2/2010 | Mallikararjunaswamy |
| 2011/0249484 | A1 * | 10/2011 | Takemura ......... G11C 11/404 365/72 |
| 2011/0298054 | A1 | 12/2011 | Luan |
| 2012/0223299 | A1 | 9/2012 | Liu |
| 2013/0215663 | A1 | 8/2013 | Chung |
| 2015/0029777 | A1 | 1/2015 | Chung |
| 2015/0380642 | A1 * | 12/2015 | Rinerson ........... G06F 17/5045 257/4 |
| 2016/0190145 | A1 * | 6/2016 | Maekawa ......... H01L 27/11206 257/50 |

FOREIGN PATENT DOCUMENTS

| | | |
|---|---|---|
| CN | 101441889 A | 5/2009 |
| CN | 101752381 A | 6/2010 |
| CN | 101872764 A | 10/2010 |
| CN | 102117813 A | 7/2011 |
| CN | 102456412 A | 5/2012 |
| CN | 101872766 B | 10/2012 |
| CN | 102054843 B | 10/2012 |
| CN | 101877329 B | 11/2012 |
| CN | 102064178 B | 7/2013 |
| CN | 103855160 A | 6/2014 |
| CN | 104538362 A | 4/2015 |
| CN | 104576648 A | 4/2015 |
| CN | 104600073 A | 5/2015 |
| CN | 103390588 B | 8/2015 |
| CN | 103165614 B | 9/2015 |
| CN | 102916013 B | 1/2016 |

OTHER PUBLICATIONS

Biškup, N. Origin of the colossal dielectric response of Pr0.6Ca0.4MnO3. Physical Review B 72, 024115 (2015).*

Alex Hoefler et. al., "Analysis of a Novel Electrically Programmable Active Fuse for Advanced CMOS SOI One-Time Programmable Memory Applications," IEEE, ESSDERC, 2006, pp. 230-233.

Greg Uhlmann et al., "A Commercial Field-Programmable Dense eFUSE Array Memory with 99.999% Sense Yield for 45nm SOI CMOS," IEEE International Solid-State Circuits Conference, 2008, pp. 406-407.

Min Shi et al., "Zero-Mask Contact Fuse for One-Time-Programmable Memory in Standard CMOS Processes," IEEE Electron Device Letters, vol. 32, No. 7, Jul. 2011, pp. 955-957.

Min-Che Hsieh et al., "Characterization of Multilayer Metal Gate Fuse in 28-nm CMOS Logic Technology," IEEE Electron Device Letters, vol. 34, No. 9, Sep. 2013, pp. 1088-1090.

Hyouk-Kyu Cha et al., "A High-Density 64-Bit One-Time Programmable ROM Array with 3-Transistor Cell Standard CMOS Gate-Oxide Antifuse," Journal of Semiconductor Technology and Science, vol. 4, No. 2, Jun. 2004, pp. 106-109.

J. Peng et al., "A Novel Embedded OTP NVM Using Standard Foundry CMOS Logic Technology," IEEE, NVSMW, 2006, pp. 24-26.

Rick Shih-Jye Shen et al., "A High-Density Logic CMOS Process Compatible Non-Volatile Memory for Sub-28nm Technologies," IEEE, VLSI Technology Digest of Technical Papers, 2014, pp. 34-35.

Richard J. McPartland et al., "1.25 Volt, Low Cost, Embedded Flash Memory for Low Density Applications," IEEE, VLSI Circuits Digest of Technical Papers, 2000, pp. 158-161.

Chia-En Huang et al., "A Study of Self-Aligned Nitride Erasable OTP Cell by 45-nm CMOS Fully Compatible Process," IEEE Transactions on Electron Devices, vol. 56, No. 6, Jun. 2009, pp. 1228-1234.

Chia-Chun Lin et al., "One-Time Programmable Memory Based on ZrTiOx Antifuse for Crossbar Memory Application Featuring High Speed Operation and Low Power Consumption," IEEE Electron Device Letters, vol. 34, No. 12, Dec. 2013, pp. 1518-1520.

E. R. Hsieh et al., "The Demonstration of Low-cost and Logic Process Fully-Compatible OTP Memory on Advanced HKMG CMOS with a Newly found Dielectric Fuse Breakdown," 2015 IEEE International Electron Devices Meeting (IEDM), Dec. 2015, pp. 52-55.

* cited by examiner

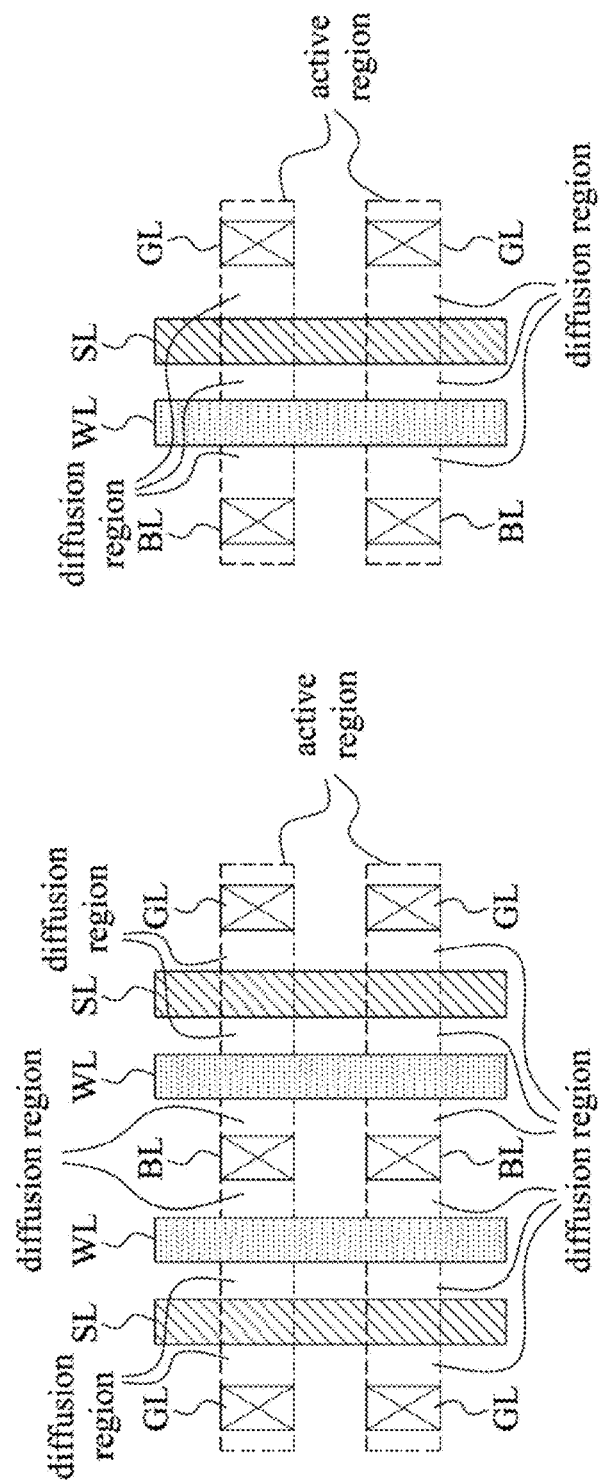

DIELECTRIC FUSE MEMORY CIRCUIT AND OPERATION METHOD THEREOF

RELATED APPLICATIONS

This application claims priority to U.S. Provisional Application Ser. No. 62/198,666, filed Jul. 29, 2015, which is herein incorporated by reference.

BACKGROUND

Field of Invention

The present invention relates to a memory. In particular, the present invention relates to one-time programming and repeatedly random read integrated circuit memory.

Description of Related Art

One time programming (OTP) memory and multi time programming (MTP) memory have three main kinds as shown below. The first kind memory is a traditional kind memory that metal atomic in the metal connection will be moved due to electromigration when there is a high current, thereby the metal connection is disconnected so as to form fuse-type wire memory. It can be implemented by Al/Cu/Silicide liner, poly-Si liner, contact via, or metal gate liner.

The second kind memory is that as the thickness of the gate dielectric layer is getting thinner, the breakdown electric field of the dielectric layer becomes lower; and therefore, such breakdown causes the changes of gate dielectric conductivity from low to high so as to form anti-fused type. Compared with metal electro-migration fused breakdown, anti-fused breakdown of the gate dielectric layer is steady in operation and needs lower area per unit cell. Hence, the anti-fused type memory becomes more popular in OTP application.

The third kind memory is using charge storage. For example, silicon-oxide-nitride-oxide-silicon (SONOS) structure or floating-gate on a MOSFET forms as a flash memory; or using spacers of the poly-Si CMOS stores electric charge for achieving information storage.

The first kind memory needs large area, high operation current, and its read margin is small. Therefore, the first kind memory is merely suitable for simple code programming. The second kind memory has better retention and does not need additional photomask. Furthermore, the second kind memory does not need special manufacturing process; and therefore its manufacturing cost is low. However, its drawback is charge loss and yields to poor retention.

In view of the foregoing, problems and disadvantages are associated with existing products that require further improvement. However, those skilled in the art have yet to find a solution.

SUMMARY

The following presents a simplified summary of the disclosure in order to provide a basic understanding to the reader. This summary is not an extensive overview of the disclosure and it does not identify key/critical elements of the present disclosure or delineate the scope of the present disclosure.

One aspect of the present disclosure is related to an integrated circuit memory. The integrated circuit memory comprises plural memory cells. Each of the memory cells is connected to at least one decoding line or at least one ground line, and each of the memory cells comprises a first field-effect transistor and a second field-effect transistor. The first field-effect transistor comprises a first region, a second region and a third region. The third region is connected to the first region and the second region. In addition, the first field-effect transistor further comprises at east one gate dielectric layer and at least one gate electrode layer. At least one gate dielectric layer is disposed on the third region. At least one gate electrode layer is configured to receive and apply an electric signal to the gate dielectric layer, such that the electric signal renders the conduction of the electric signal between the first region and the second region through the third region. The second field-effect transistor comprises a first region, a second region and a third region. The third region is connected to the first region and the second region. Besides, the second field-effect transistor further comprises at least one gate dielectric layer and at least one gate electrode layer. At least one gate dielectric layer is disposed on the third region. At least one gate electrode layer configured to receive and apply the electric signal to the gate dielectric layer, such that the electric signal renders the conduction of the electric signal between the first region and the second region through the third region. Applying the electric signal to the gate dielectric layer of the second field-effect transistor renders the conductivity of the gate dielectric layer from high state to low state and the conductivity of the gate dielectric layer remained unchanged by applying the electric signal to the gate dielectric layer of the second field-effect transistor. The high state and the low state of the gate dielectric layer respectively represent two different storing states of the memory cell.

According to one embodiment of the present disclosure, at least one gate electrode layer of the second field-effect transistor is connected to the first decoding line. The first region of the second field-effect transistor is connected to or shared with the second region of the first field-effect transistor. The second region of the second field-effect transistor is connected to the ground line. The gate electrode of the first field-effect transistor is connected to the second decoding line. The first region of the first field-effect transistor is connected to the third decoding line. Each of the first field-effect transistor and the second field-effect transistor further comprises a ground terminal, and the ground terminal is connected to the ground line of the memory cell. The first field-effect transistors of two adjacent memory cells of the memory cells are connected to the third decoding line. Applying the electric signal to the first decoding line, the second decoding line and the third decoding line renders the first field-effect transistor of one of the memory cells to conduct the electric signal, such that a voltage difference or a current is generated at two terminals of a gate oxide layer of the second field-effect transistor, so as to change the conductivity of the gate dielectric layer of the second field-effect transistor from high state to low state for storing information. Applying the electric signal to the first decoding line, the second decoding line and the third decoding line renders the first field-effect transistor of one of the memory cells to conduct the electric signal, and the intensity of the electric signal is sensed from the first decoding line or the third decoding line which is read as the state of the conductivity of the gate dielectric layer of the second field-effect transistor.

These and other features, aspects, and advantages of the present disclosure, as well as the technical means and embodiments employed by the present disclosure, will become better understood with reference to the following description in connection with the accompanying drawings and appended claims.

BRIEF DESCRIPTION OF THE DRAWINGS

The disclosure can be more fully understood by reading the following detailed description of the embodiment, with reference made to the accompanying drawings as follows:

FIG. 13 is a layout of an integrated circuit memory as shown in FIG. 13 according to embodiments of the present disclosure.

FIG. 14 is a layout of an integrated circuit memory as shown in FIG. 14 according to embodiments of the present disclosure.

Figure 1C:
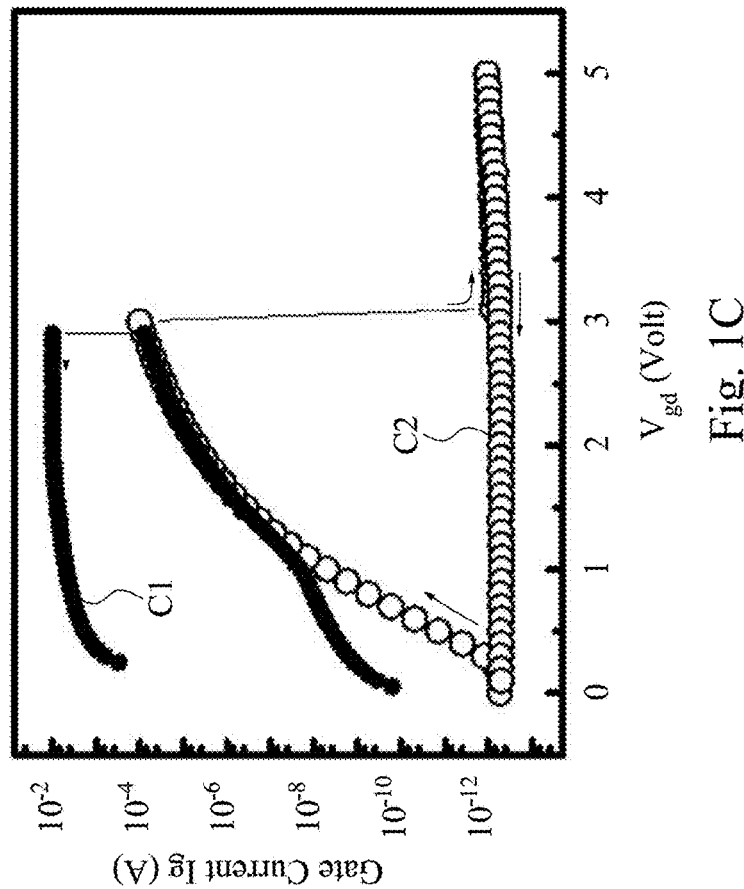
FIG. 1C is electrical characteristics of an anti-fused type dielectric and a fused type dielectric memory cell from the experiment.

In accordance with common practice, the various described features/elements are not drawn to scale but instead are drawn to best illustrate specific features/elements relevant to the present disclosure. Also, wherever possible, similar or the same reference numerals are used in the drawings and the description to refer to the same or similar parts.

DETAILED DESCRIPTION

The detailed description provided below in connection with the appended drawings is intended as a description of the present examples and is not intended to represent the only forms in which the present example may be constructed or utilized. The description sets forth the functions of the example and the sequence of steps for constructing and operating the example. However, the same or equivalent functions and sequences may be accomplished by different examples.

Unless otherwise defined herein, scientific and technical terminologies employed in the present disclosure shall have the meanings that are commonly understood and used by one of ordinary skill in the art. Unless otherwise required by context, it will be understood that singular terms shall include plural forms of the same and plural terms shall include singular forms of the same.

Figure 1A:
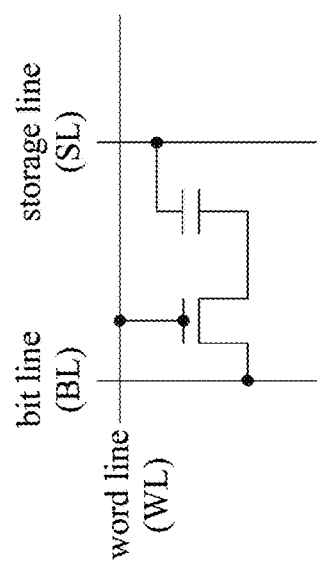
FIG. 1A is a schematic diagram of an anti-fused type dielectric memory cell according to prior art, wherein the memory cell is consisted of a control transistor (left side) and an anti-fused dielectric component (right side) connected with the control transistor in series.
Figure 1B:
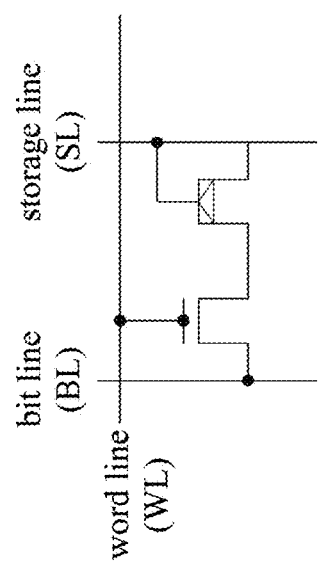
FIG. 1B is a schematic diagram of a fused type dielectric memory cell according to embodiments of the present disclosure, wherein the memory cell is consisted of a control transistor (left side) and a fused dielectric component (right side) connected with the control transistor in series.
Figure 1D:
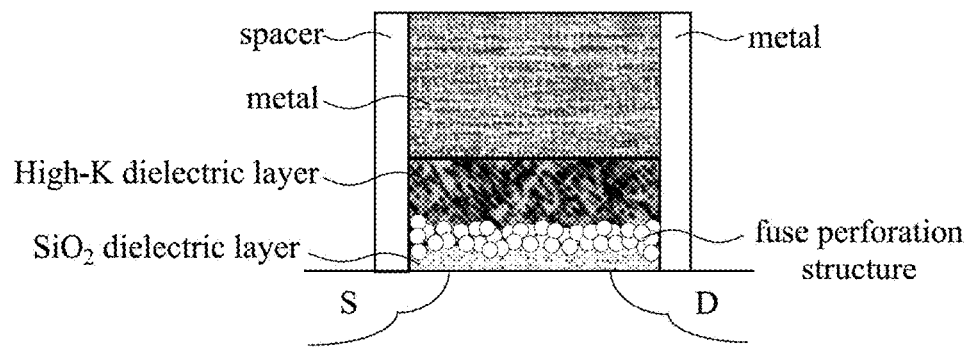
FIG. 1D is a structure of a fused type dielectric memory cell after dielectric breakdown.
Figure 1E:
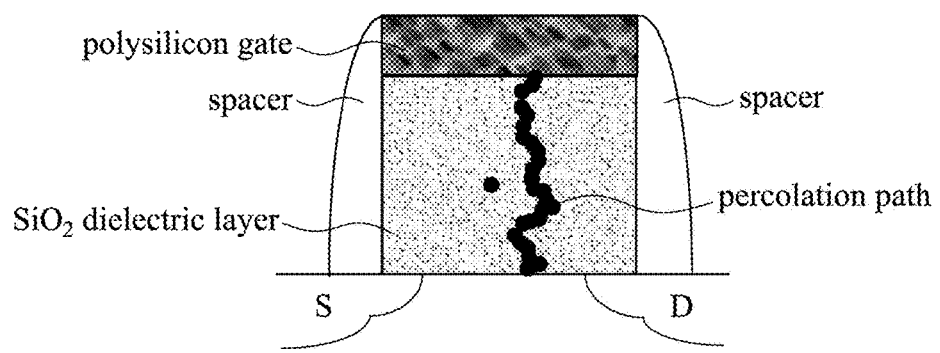
FIG. 1E is a structure of an anti-fused type dielectric memory cell after dielectric breakdown.

Different from conventional anti-fuse dielectric memory as shown in FIG. 1A, the memory of the present disclosure is basically consisted of two transistors, for example, the memory is composed of a control transistor and a dielectric fuse transistor which is connected in series with the control transistor as shown in FIG. 1B. The main characteristic of dielectric fuse mechanisms is by applying an electric field on the dielectrics, the ions or atoms in the dielectrics are drifted-out or the dielectrics are burned-out, that create damage of the dielectric structure in a form of porosity, and the conductivity (resistivity) of tunneling current through the dielectrics changes the state from high conductivity (low resistivity) to low conductivity (high resistivity), which is regard as a writing operation of a storing component. The foregoing mechanisms are validated by the manufacturing process of the high-k metal gate of the CMOS at the present stage. The characteristics of the fuse electrical property of the memory is shown in FIG. 1C. A pulse with a short time and a voltage higher than a hard breakdown voltage are applied to the gate of the transistor so as to obtain the Ig-Vgd property of the curve C2 with open circles in FIG. 1C. The change of the current from the gate to drain is from high current to low current (i.e., clockwise). On the contrary, the experiment result of the traditional anti-fused type dielectric memory is as shown by the curve C1. The change of the current from the gate to drain is from low current to high current (i.e. counter clockwise). In addition, referring to FIG. 1C, after the dielectric is anti-fused, the conductance state of the dielectric is larger and irreversible; and after the dielectric is fused, the conductance state of the dielectric is smaller and irreversible. When the gate dielectric layer of the fuse dielectric transistor of the present disclosure is fused, materials in the dielectric are drifted-out, or the dielectrics are burned-out, thereby porousness is generated in the structure; and therefore, the conduction path from the gate to the transistor is blocked by the porousness, such that the transistor is regarded as an open circuit as shown in FIG. 1D; on the contrary, after the gate dielectric layer of the traditional anti-fused type dielectric transistor anti-fused, the dielectric layer is penetrated by current and forms a conduction path, such that the resistance from the gate to the drain is reduced (the conductance state is enhanced). The gate to the oxide layer of the traditional anti-fused type dielectric transistor forms a leakage path, for example, the circle symbols in FIG. 1E are connected in series to form a percolation path.

Figure 2A:
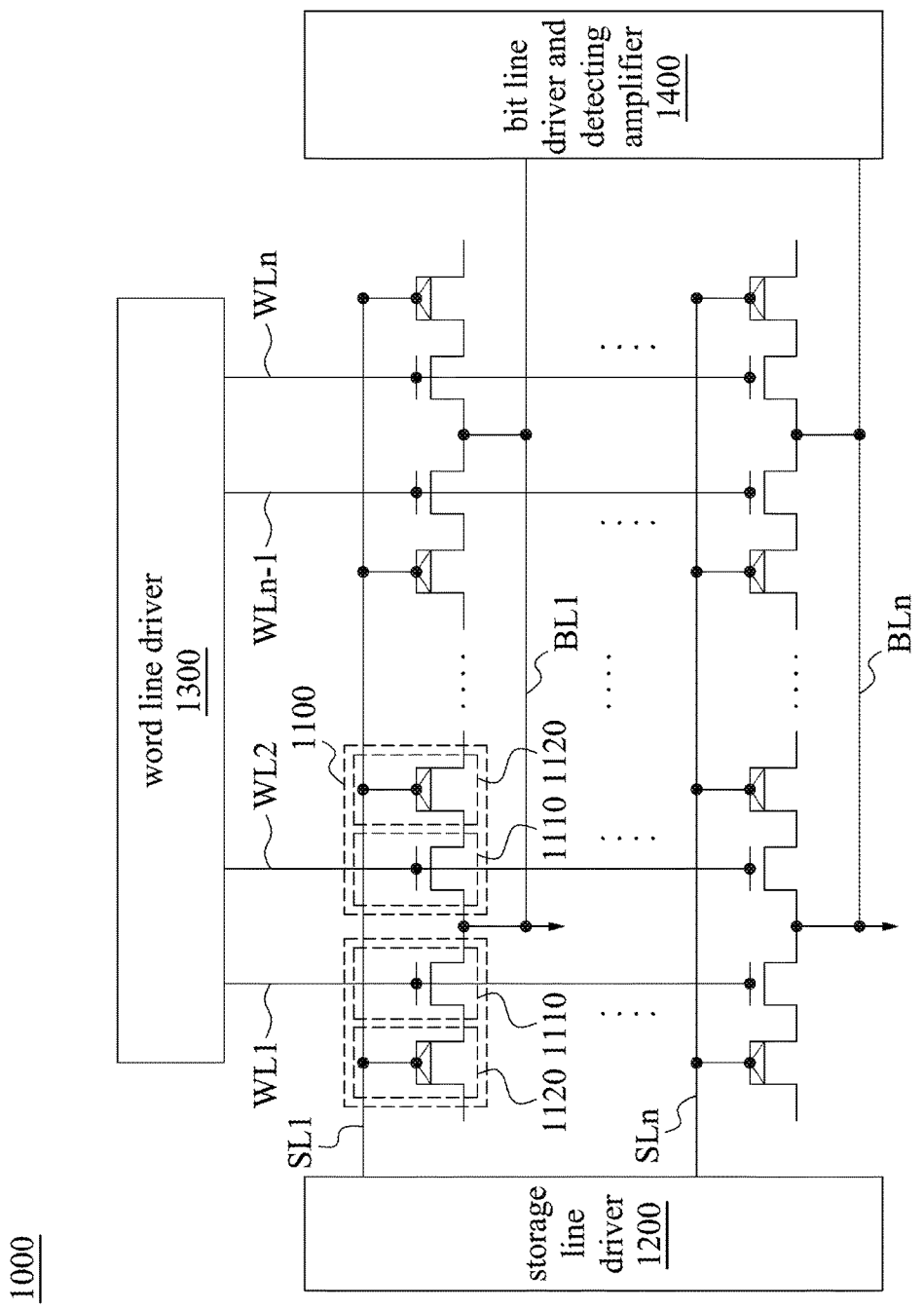
FIG. 2A is a schematic diagram of an integrated circuit memory according to embodiments of the present disclosure.

FIG. 2A is a schematic diagram of an integrated circuit memory 1000 according to embodiments of the present disclosure. The integrated circuit memory 1000 is a dielectric fuse one time programming (OTP) integrated circuit memory. The field effect transistor 1110 being regarded as a control component and the field effect transistor 1120 being capable of providing dielectric fuse are connected in series to form the memory cell 1100 of the integrated circuit memory 1000. The word line WL is connected to the gate of one of the field effect transistors 1110 of the memory cell 1100 of the integrated circuit memory 1000. The storage line SL is connected to the gate of one of the field effect transistors 1120 of the memory cell 1100 of the integrated circuit memory 1000. Bit line BL is connected with drains of the field effect transistors 1110 of two adjacent memory cells 1100. In addition, the storage line driver 1200 is connected to and provides electrical signals for the storage line SL, the word line driver 1300 is connected to and provides electrical signals for the word line WL, the Bit line driver and the sense amplifier 1400 is connected to and provides electrical signals for the Bit line BL.

Figure 2B:
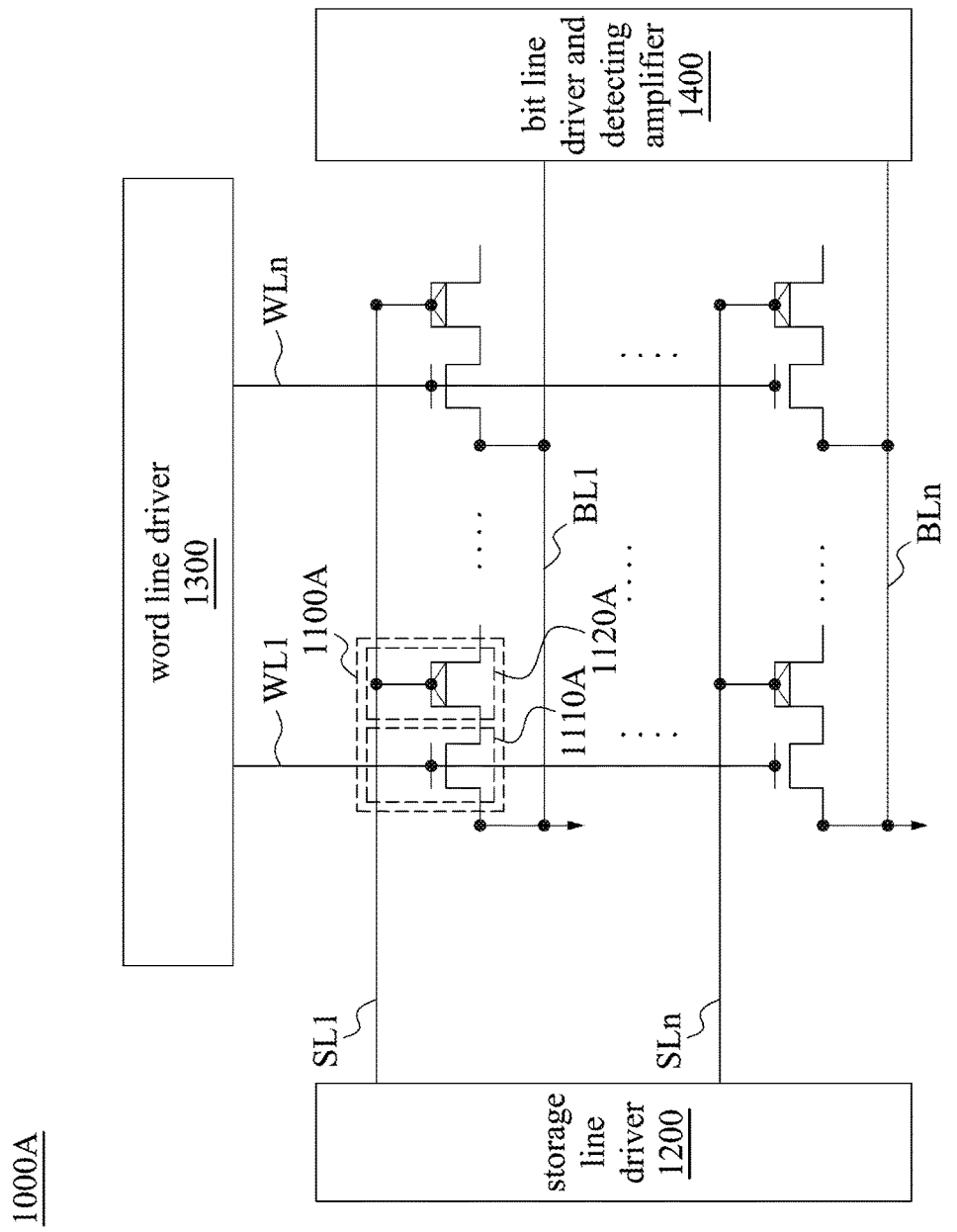
FIG. 2B is a schematic diagram of an integrated circuit memory according to embodiments of the present disclosure.

FIG. 2B is a schematic diagram of an integrated circuit memory 1000A according to embodiments of the present disclosure. The integrated circuit memory 1000A is a dielectric fuse one time programming (OTP) integrated circuit memory. The field effect transistor 1110A being regarded as a control component and the field effect transistor 1120A being capable of providing dielectric fuse is connected in series to form the memory cell 1100A of the integrated circuit memory 1000A. The word line WL is connected to the gate of one of the field effect transistors 1110A of the memory cell 1100A of the integrated circuit memory 1000A. The storage line SL is connected to the gate of one of the field effect transistors 1120A of the memory cell 1100A of the integrated circuit memory 1000A. The Bit line is connected to the drain of one of the field effect transistors 1110A of the memory cell 1100A of the integrated circuit memory 1000A.

Figure 3:
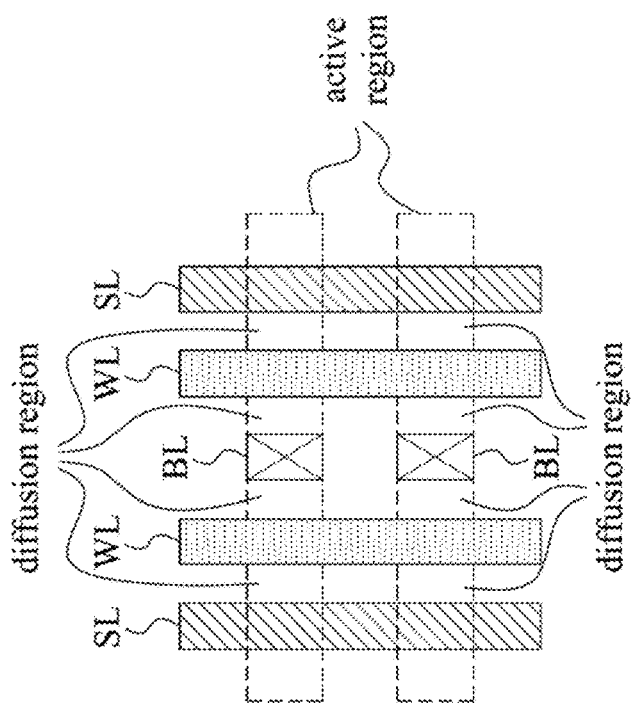
FIG. 3 is a layout of an integrated circuit memory as shown in FIG. 2A according to embodiments of the present disclosure.

FIG. 3 is a layout of an integrated circuit memory 1000 as shown in FIG. 2A according to embodiments of the present disclosure. As shown in the figure, the diffusion region is within the active region. The word line WL is disposed on the diffusion region perpendicularly. The control component (i.e., the field effect transistor 1110) can be disposed at the intersection of the word line WL and the diffusion region. The storage line SL is adjacent to the word line WL, and disposed on the diffusion region perpendicularly. The storage component (i.e., the field effect transistor 1120) can be disposed at the intersection of the storage line SL and the diffusion region. The Bit line is perpendicular to the diffusion region, the word line WL and the storage line SL, and the Bit line is connected to the diffusion region through the via and the metal plug extended to the middle of two adjacent word lines WL.

Figure 4:
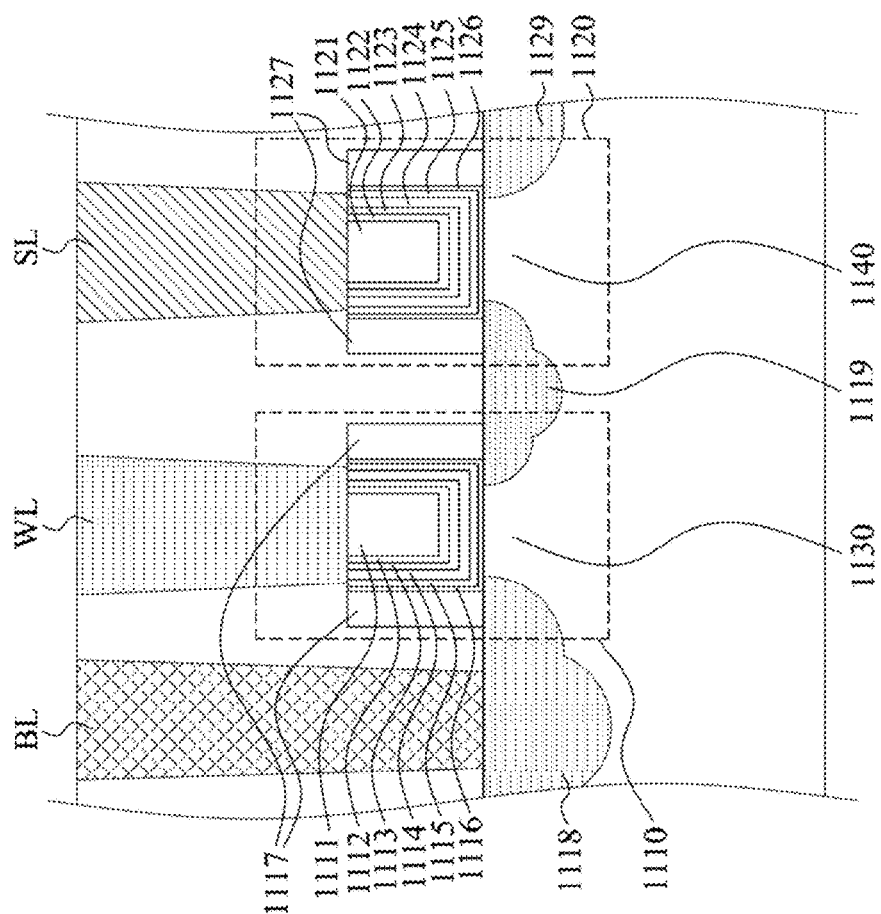
FIG. 4 is a structure diagram of an integrated circuit memory according to embodiments of the present disclosure.

FIG. 4 is a structure diagram of an integrated circuit memory 1000 according to embodiments of the present disclosure. The field effect transistor 1110 being regarded as a control component and the field effect transistor 1120 being regarded as a storing component are connected to form the memory cell 1100 of the integrated circuit memory 1000. The field effect transistor 1110, 1120 can be implemented by High-K metal gate metal-oxide-semiconductor field-effect transistor (HKMG MOSFET). HKMG MOSFET is composed of drain/source 1118/1119/1129, tunnel 1130/1140, gate dielectric and gate metal. The drain/source 1118/1119/1129 can conduct electrical signals, the tunnel 1130/1140 is disposed between the drain and the source which can control electrical signal, the gate dielectric is disposed above the tunnel, and the gate metal is disposed above the gate dielectric. The gate dielectric of the HKMG MOSFET is composed of an interfacial layer 1116/1126 and a High-K dielectric layer. The gate metal is composed of three layers. The first layer is a barrier metal layer 1114/1124, the second layer is a work function metal layer 1113/1123, and the third layer is a block metal layer 1112/1122. The contact metal 1111/1121 is connected to and disposed above the gate metal. The contact metal 1111 of the field effect transistor 1110 is connected to or shared with the word line WL. The contact metal 1141 of the field effect transistor 1120 is connected to or shared with the storage line SL. The drain 1119 of the field effect transistor 1120 is connected to or shared with the source 1119 of the field effect transistor 1110. In addition, the drain 1118 of the field effect transistor 1110 is connected to the Bit line. Furthermore, spacers 1117, 1127 are disposed at bilateral sides of the interfacial layer 1116/1126.

In one embodiment, if the electric signal is applied to the gate dielectric layer of the field-effect transistor 1120, the conductivity of the gate dielectric layer is changed from high state to low state, and the conductivity of the gate dielectric layer is not changed by applying the electric signal to the gate dielectric layer of the field-effect transistor 1120 again. The high state and the low state of the gate dielectric layer are used for storing information. In another embodiment, the field-effect transistors 1110 of two adjacent memory cells 1100 of the memory cells 1100 of the integrated circuit memory 1000 are connected to the Bit line BL.

In another embodiment, applying the electric signal to the storage line SL, the word line WL and the Bit line BL renders the field-effect transistor 1110 of one of the memory cells 1100 to conduct the electric signal, such that a voltage difference or a current is generated at two terminals of a gate oxide layer of the field-effect transistor 1120, so as to change the conductivity of the gate dielectric layer of the field-effect transistor 1120 from high state to low state for storing information. In one embodiment, applying the electric signal to the storage line SL, the word line WL and the Bit line BL render the field-effect transistor 1110 of one of the memory cells 1100 to conduct the electric signal and the intensity of the electric signal is sensed from the storage line SL or the Bit line BL which is read as the state of the conductivity (resistivity) of the gate dielectric layer of the field-effect transistor 1120. In one embodiment, the gate dielectric layer comprises silicon oxide, silicon nitride, silicon oxy-nitride aluminum oxide, aluminum oxy-nitride or high dielectric constant (high-k) material. High-k dielectrics comprise metal oxides, including oxides of Li, Be, Mg, Ca, Sr, Sc, Y, Zr, Hf, Al, La, Ce, Pr, Nd, Sm, Eu, Gd, Tb, Dy, Ho, Er, Tm, Yb, Lu and mixtures thereof. In another embodiment, the gate dielectric layer of the field-effect transistor is composed of an interfacial layer 1116/1126 and a High-K dielectric layer 1115/1125. The relative dielectric constant of the High-K dielectric layer 1115/1125 is larger than 3.9, and the thickness of the interfacial layer 1116/1126 is less or equal to 7 nanometers. In another embodiment, the gate electrodes of the field-effect transistors 1110, 1120 comprise polycrystalline silicon or comprise metal selected from a group of W, Cu, Ti, Ag, Al, TiAl, TiAlN, TaC, TaCN, TaSiN, Mn, Zr, TiN, WN, TaN, and Ru or combinations thereof. In still another embodiment, the field-effect transistors 1110, 1120 can be n type MOSFET, p type MOSFET, n type junction-less MOSFET, p type junction-less MOSFET, n type Fin-FET, p type FinFET, n type trigate MOSFET, p type trigate MOSFET, n type nanowire MOSFET, or p type nanowire MOSFET.

Figure 5:
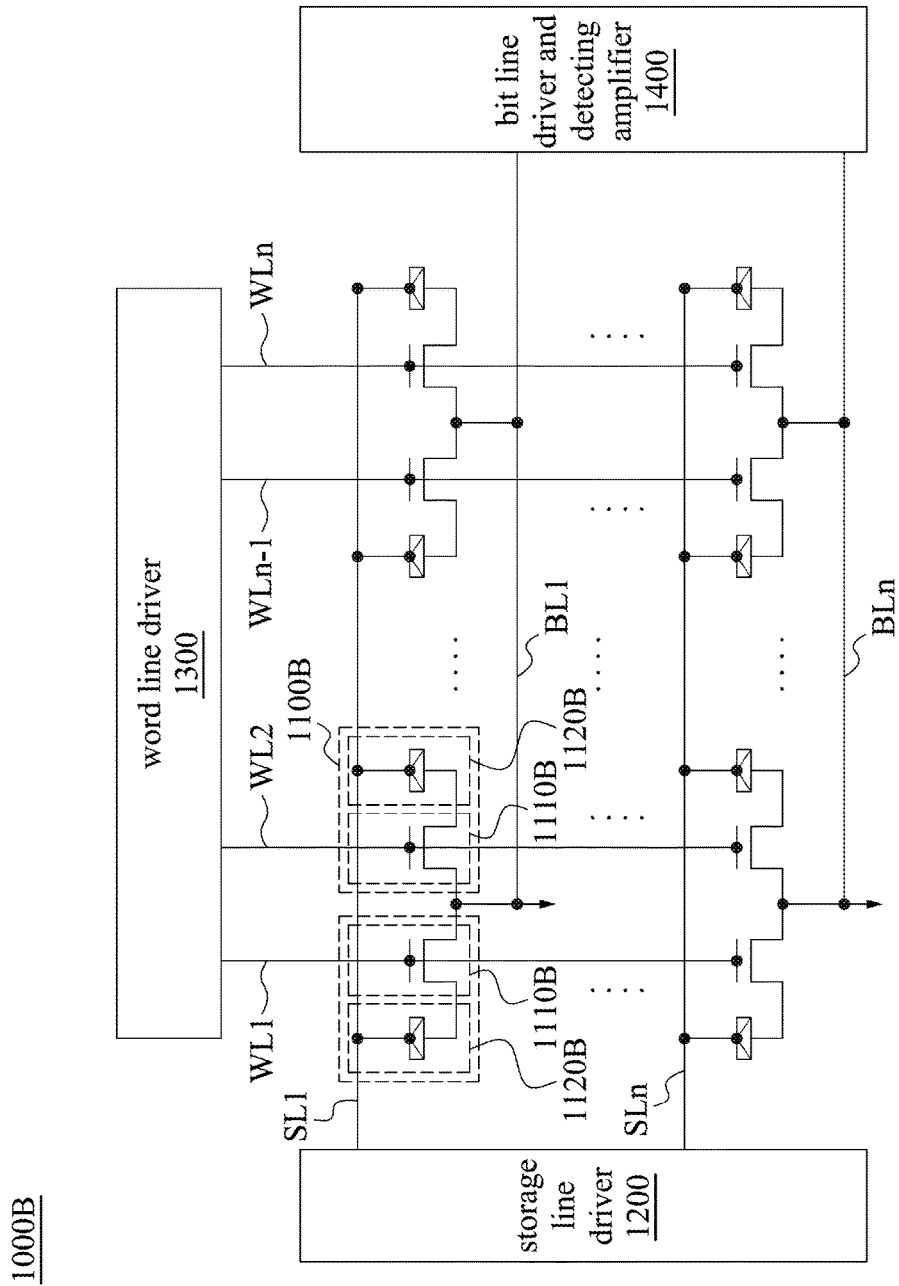
FIG. 5 is a schematic diagram of an integrated circuit memory according to embodiments of the present disclosure.
Figure 6:
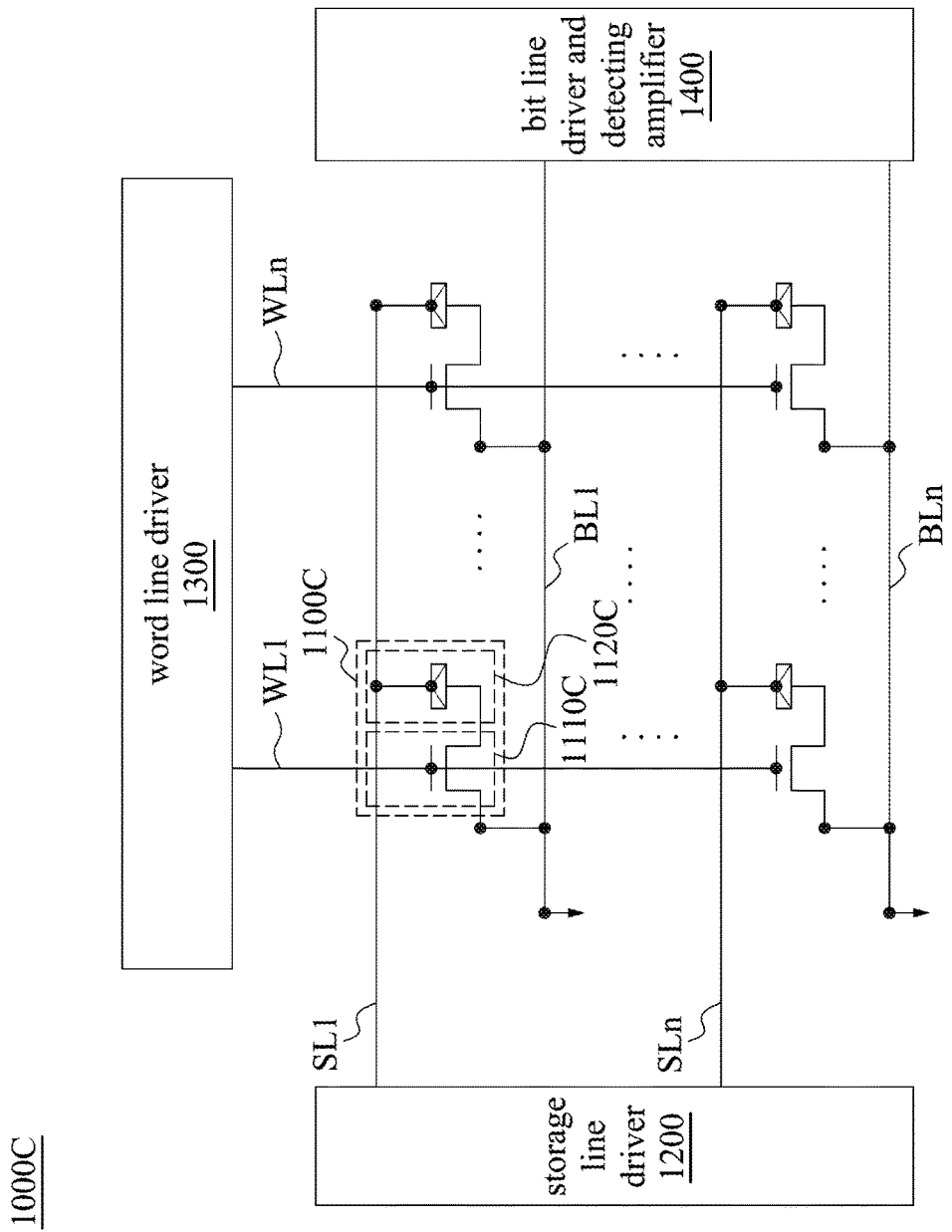
FIG. 6 is a schematic diagram of an integrated circuit memory according to embodiments of the present disclosure.

FIG. 5 is a schematic diagram of an integrated circuit memory 1000B according to embodiments of the present disclosure. Compared with the field-effect transistor 1120 for providing dielectric fuse in FIG. 2A, the integrated circuit memory 1000B in FIG. 5 is implanted by a storing component 1120B for providing dielectric fuse. FIG. 6 is a schematic diagram of an integrated circuit memory 1000C according to embodiments of the present disclosure. Compared with the field-effect transistor 1120A for providing dielectric fuse in FIG. 2B, the integrated circuit memory 1000C in FIG. 6 is implanted by a storing component 1120C for providing dielectric fuse.

Figure 7:
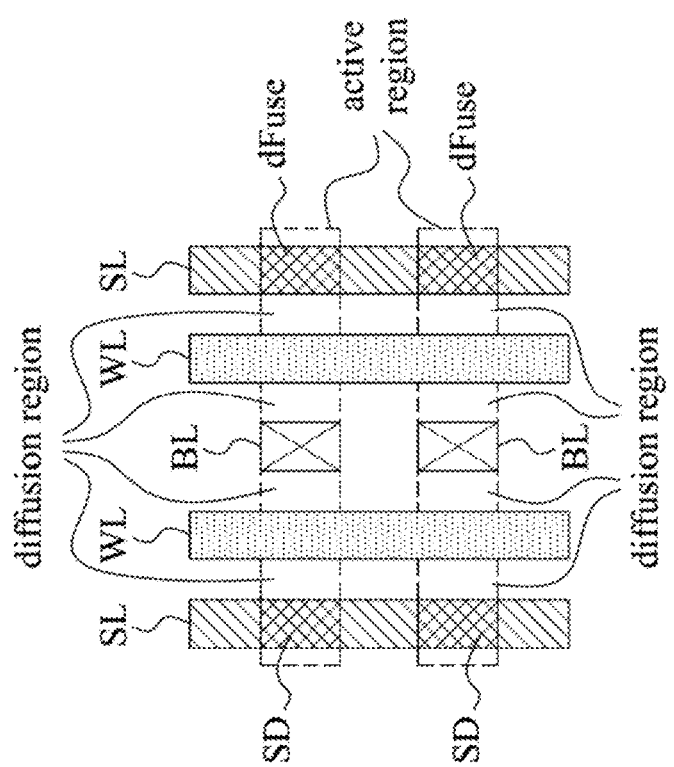
FIG. 7 is a layout of an integrated circuit memory as shown in FIG. 6 according to embodiments of the present disclosure.

FIG. 7 is a layout of an integrated circuit memory 1000B as shown in FIG. 5 according to embodiments of the present disclosure. As shown in the figure, the diffusion region is within the active region. The word line WL is disposed on the diffusion region perpendicularly. The control component (i.e., the field effect transistor 1110B) can be disposed at the intersection of the word line WL and the diffusion region. The storage line SL is adjacent to the word line WL, and disposed on the diffusion region perpendicularly. The storing component (i.e., the storing component 1120B) can be disposed at the intersection of the storage line SL and the diffusion region. The Bit line BL is perpendicular to the diffusion region, the word line WL, and the storage line SL, and the Bit line BL is connected to the diffusion region through the via and the metal plug extended to the middle of two adjacent word lines WL.

Figure 8:
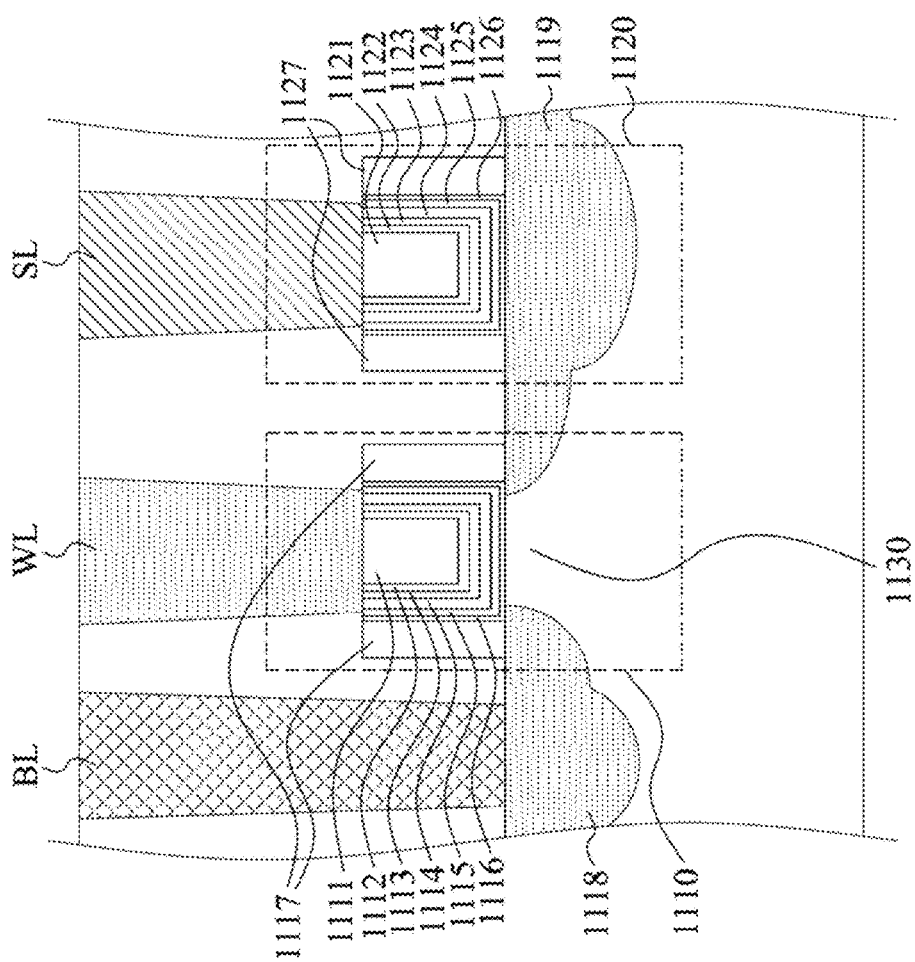
FIG. 8 is a structure diagram of an integrated circuit memory according to embodiments of the present disclosure.
Figure 9:
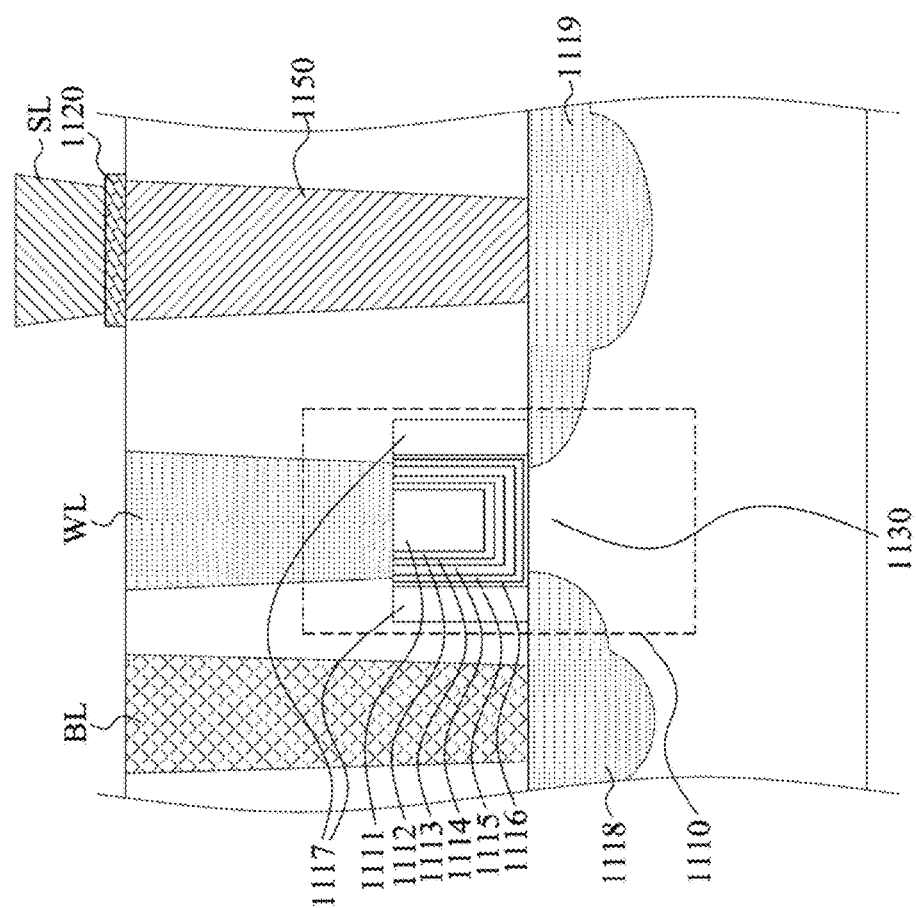
FIG. 9 is a structure diagram of an integrated circuit memory according to embodiments of the present disclosure.
Figure 10:
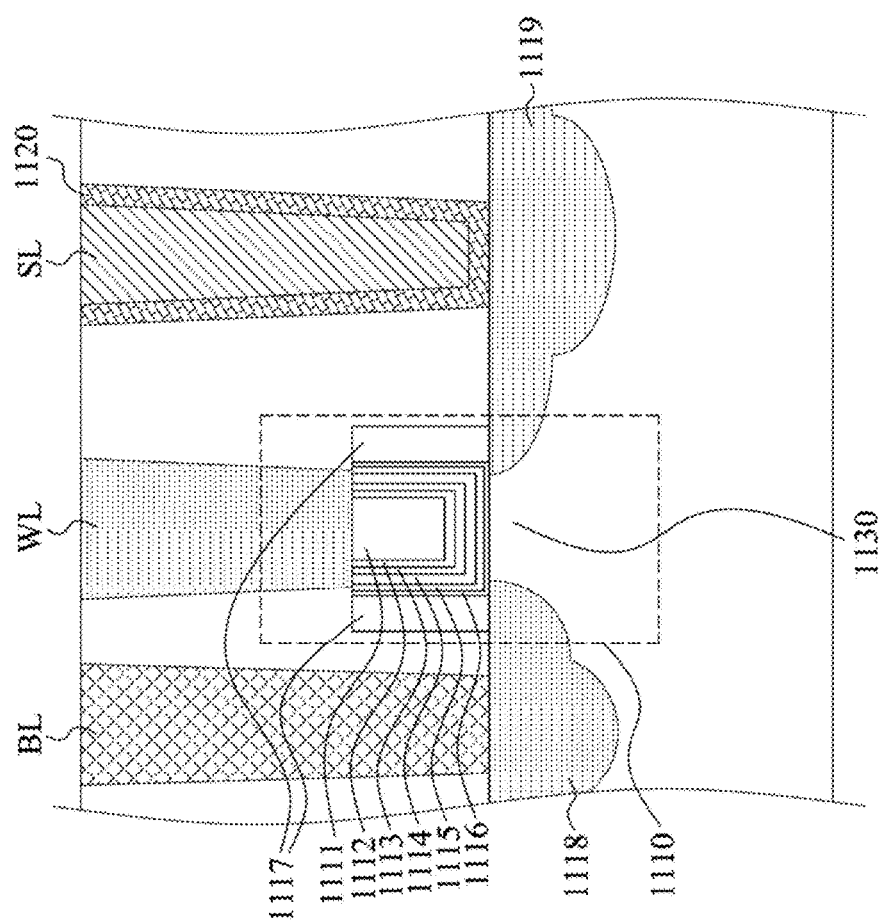
FIG. 10 is a structure diagram of an integrated circuit memory according to embodiments of the present disclosure.
Figure 11:
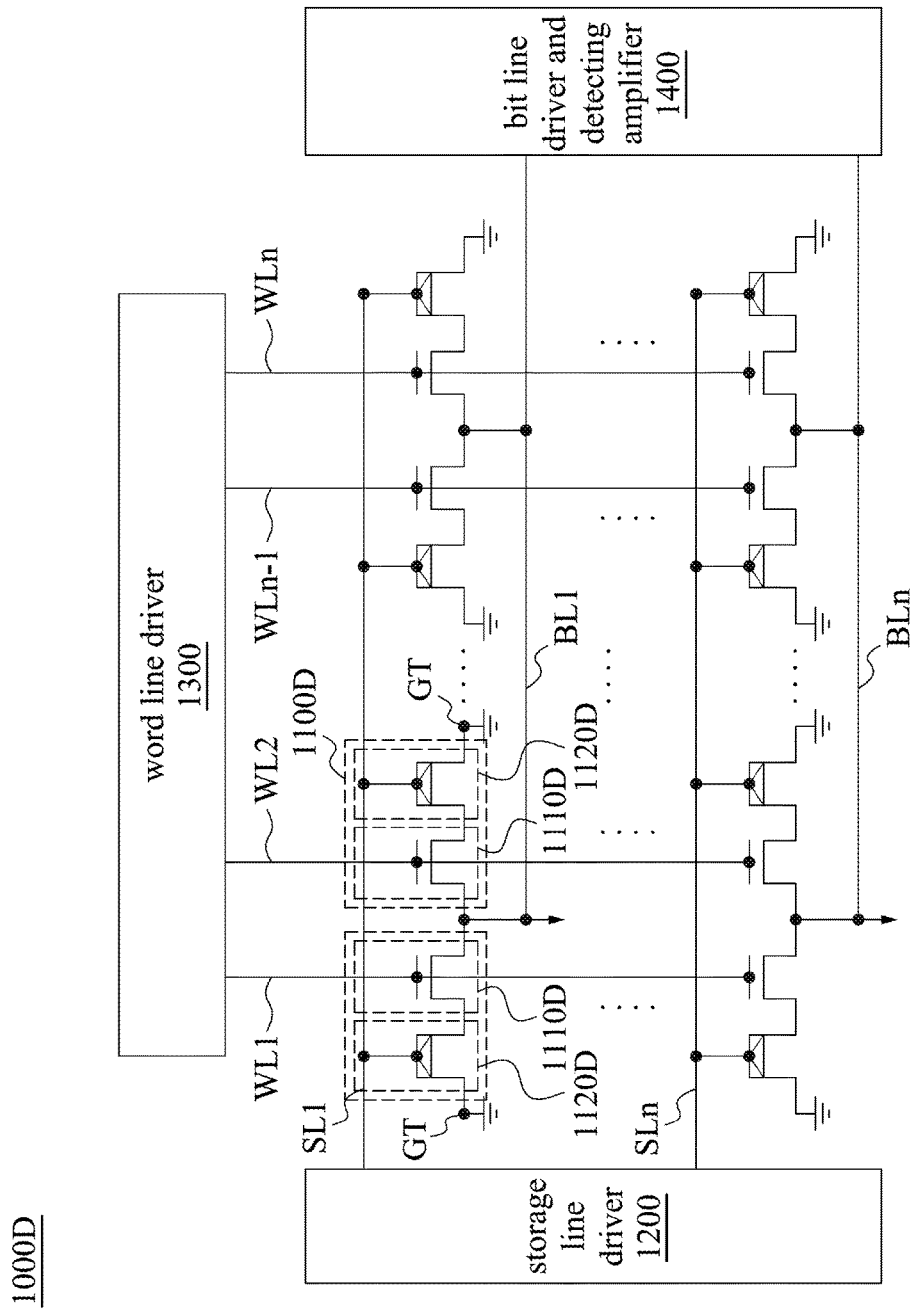
FIG. 11 is a schematic diagram of an integrated circuit memory according to embodiments of the present disclosure.
Figure 12:
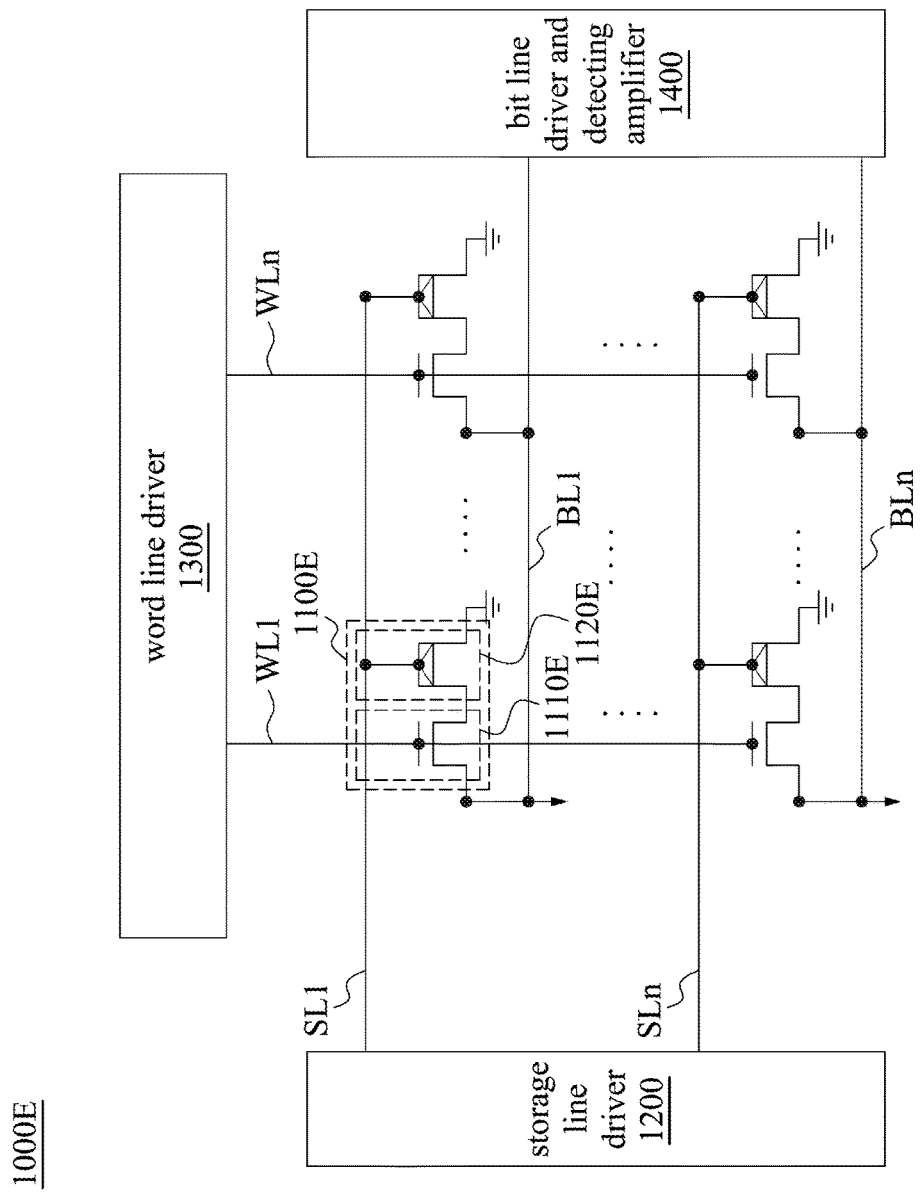
FIG. 12 is a schematic diagram of an integrated circuit memory according to embodiments of the present disclosure.

FIGS. 8~10 are structure diagrams of integrated circuit memories according to embodiments of the present disclosure. Compared with the structure of the integrated circuit memory in FIG. 4, the disposition of the storage component 1120 of the integrated circuit memory in FIGS. 10-12 are different, which will be described as below. As shown in FIG. 8, the first terminal of the storage component 1120 is connected to the storage line SL, and the second terminal of the storage component 1120 is connected to the second region 1119 of the field-effect transistor 1110. As shown in FIG. 9, the first terminal of the storage component 1120 is connected to the storage line SL, and the second terminal of the storage component 1120 is connected to the second region 1119 of the field-effect transistor 1110 through the contact via 1150. As shown in FIG. 10, the first surface of the storage component 1120 is connected to the storage line SL, and the second surface which is opposite to the first surface of the storage component 1120 is connected to the second region 1119 of the field-effect transistor 1110.

In one embodiment, the dielectric layer of the storage component 1120 is composed of an interfacial layer 1116/1126 and a High-K dielectric layer 1115/1125. The relative dielectric constant of the High-k dielectric layer 115/1125 is larger than 3.9, and the thickness of the interfacial layer 1116/1126 is less or equal to 7 nanometers. In another embodiment, the dielectric layer comprises silicon oxide, silicon nitride, silicon oxy-nitride, aluminum oxide, aluminum oxy-nitride or high dielectric constant (high-k) material, High-k dielectrics comprise metal oxides, including oxides of Li, Be, Mg, Ca, Sr, Sc, Y, Zr, Hf, Al, La, Ce, Pr, Nd, Sm, Eu, Gd, Tb, Dy, Ho, Er, Tm, Yb, Lu and mixtures thereof. Applying the electric signal to the dielectric of the storing component 1120 renders the conductivity of the dielectric from high state to low state for storing information thereby writing information into the storing component 1120, and the conductivity of the dielectric is not changed by applying the electric signal to the dielectric of the storing component 1120 again. In addition, the high state and the low state of the dielectric are used for storing information.

In another embodiment, the storing component 1120 further comprises a first layer portion and a second layer portion. The dielectric of the storing component 1120 is disposed on the first layer portion, and the second layer portion is disposed on the dielectric. The first layer portion can be but not limited to a first electrode or a first interconnect, and the second layer portion can be but not limited to a second electrode or a second interconnect.

In still another embodiment, the gate electrode layer of the field-effect transistor 1110 is connected to the word line WL, and the first region 1118 of the field-effect transistor 1110 is connected to the Bit line BL. In addition, the field-effect transistor 1110 further comprises a ground terminal (not shown in the figure), and the ground terminal is connected to the ground line (not shown in the figure) of the memory cell 1100.

Reference is now made to FIGS. 5, 6. In another embodiment, the field-effect transistors 1110B, 1110C of two adjacent memory cells of the memory cells 1100B, 1100C in the integrated circuit memory 1000B, 1000C are connected to the Bit line BL.

In still another embodiment, applying the electric signal to the storage line SL, the word line WL and the Bit line BL render the field-effect transistor 1110 of one of the memory cells 1100 to conduct the electric signal, such that a voltage difference or a current is generated at two terminals of the storing component 1120, so as to change the conductivity of the dielectric of the storing component 1120 from high state to low state, the conductivity of the storing component 1120 is therefore changed for storing information. In one embodiment, applying the electric signal to the storage line SL, the word line WL and the Bit line BL render the field-effect transistor 1110 of one of the memory cells 1100 to conduct the electric signal, and the intensity of the electric signal is sensed from the storage line SL or Bit line BL which is read as high state or low state of the conductivity of the storing component.

Referring to table 1 as shown below, it represents operations of the integrated circuit memory 1000, 1000B, 1000C of embodiments in FIGS. 5, 6 of the present disclosure. During programming, $V_{WL}$ voltage is applied to the selected word line WL, 0V (volt) voltage is applied to the unselected word line WL. $V_{BL}$ voltage is applied to the selected Bit line BL, 0V voltage is applied to the unselected Bit line BL. $V_{SR}$ voltage is applied to the selected storage line SL, 0V voltage is applied to the unselected storage line SL. If there is a ground line, 0V voltage is applied to the ground line. During reading, $V_{DD}$ voltage is applied to the selected word line WL, 0V voltage is applied to the unselected word line WL, $0.1V_{DD}$~$V_{DD}$ voltage is applied to the selected Bit line BL, 0V voltage is applied to the unselected Bit line L. $V_{DD}$ voltage is provided to the selected storage line SL, 0V voltage is applied to the unselected storage line SL. If there is a ground line, 0V voltage is applied to the ground line.

Table 1, Operation Conditions

| operation | conditions | | | | | | |
|---|---|---|---|---|---|---|---|
| | World line | | Bit Line | | Storage Line | | Ground |
| | Selected | Unselected | Selected | Unselected | Selected | Unselected | (optional) |
| Program | $V_{WL}$ | 0 V | $V_{BL}$ | 0 V | $V_{SR}$ | 0 V | 0 V |
| Read | $V_{DD}$ | 0 V | 0.1 $V_{DD}$~$V_{DD}$ | 0 V | $V_{DD}$ | 0 V | 0 V |

FIG. 11 is a schematic diagram of an integrated circuit memory 1000D according to embodiments of the present disclosure. Compared with the disposition of the field-effect transistor 1120 in FIG. 2A, one terminal of the field-effect transistor 1120D as a storage component in FIG. 11 is grounded to a ground line GL through the ground terminal GT. FIG. 12 is a schematic diagram of an integrated circuit memory 1000E according to embodiments of the present disclosure. Compared with the disposition of the field-effect transistor 1120 in FIG. 2A, one terminal of the field-effect transistor 1120E as a storage component in FIG. 12 is grounded.

FIG. 13 is a layout diagram of an integrated circuit memory 1000D as shown in FIG. 11 according to embodiments of the present disclosure. As shown in the figure, the diffusion region is within the active region. The word line WL is disposed on the diffusion region perpendicularly. The control component (i.e., the field effect transistor 1110D) can be disposed at the intersection of the word line WL and the diffusion region. The storage line SL is adjacent to the word line WL, and disposed on the diffusion region perpendicularly. The storage component (i.e., the field effect transistor 1120D) can be disposed at the intersection of the storage line SL and the diffusion region. The Bit line BL is perpendicular to the diffusion region, the word line WL, and the storage line SL, and the Bit line BL is connected to the diffusion region through the via and the metal plug extended to the middle of two adjacent word lines WL. In addition, two ground lines GL are adjacent to two storage lines SL, disposed at outer side of the two storage lines SL, and disposed on the diffusion region perpendicularly.

FIG. 14 is a layout of an integrated circuit memory 1000E as shown in FIG. 12 according to embodiments of the present disclosure. The diffusion region is within the active region. The word line WL is disposed on the diffusion region perpendicularly. The control component (i.e., the field effect transistor 1110E) can be disposed at the intersection of the word line WL and the diffusion region. The storage line SL is adjacent to the word line WL, and disposed on the diffusion region perpendicularly. The storage component (i.e., the field effect transistor 1120E) can be disposed at the intersection of the storage line SL and the diffusion region. The Bit line BL is perpendicular to the diffusion region, the word line WL, and the storage line SL, and the Bit line BL is connected to the diffusion region through the via and the metal plug extended to the middle of two adjacent word lines WL. In addition, the ground line GL is adjacent to the storage line SL, and disposed on the diffusion region perpendicularly.

Figure 15:
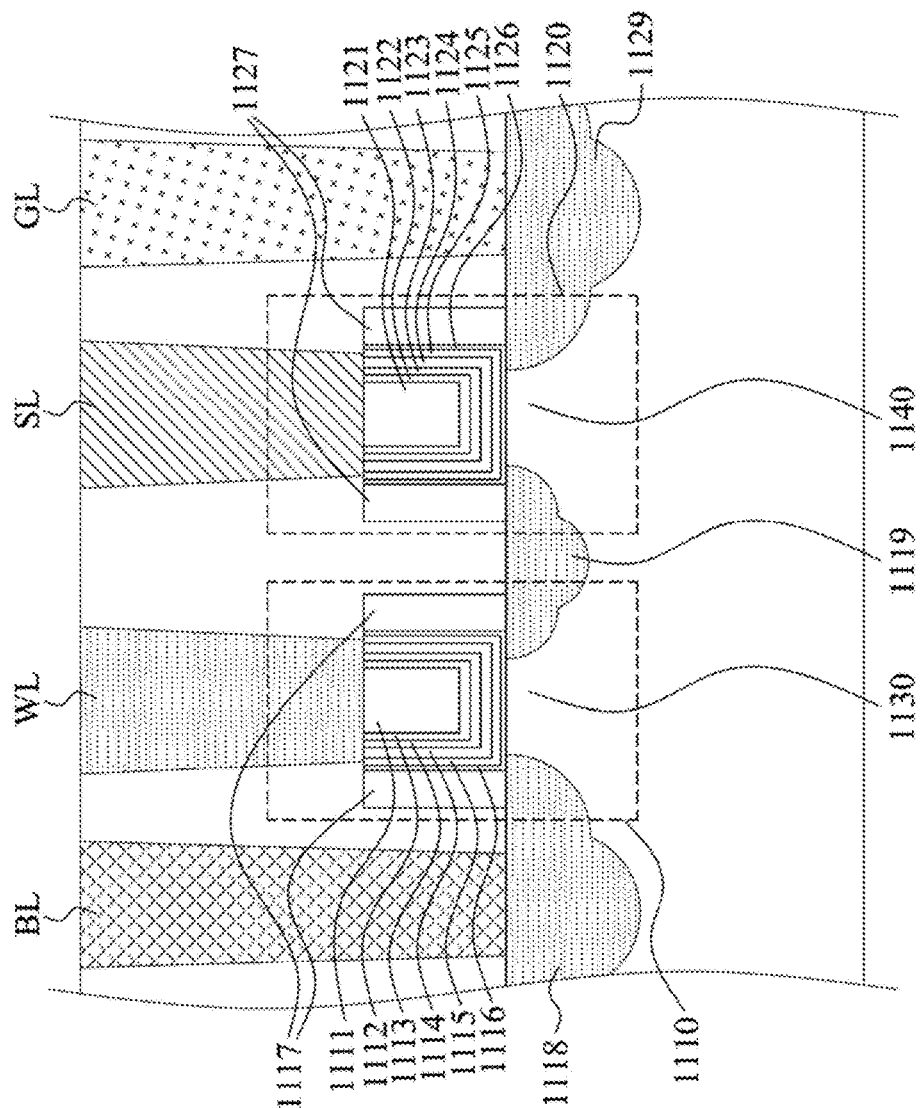
FIG. 15 is a structure diagram of an integrated circuit memory according to embodiments of the present disclosure.

FIG. 15 is a structure diagram of an integrated circuit memory according to embodiments of the present disclosure. Compared with the structure of the integrated circuit memory in FIG. 4, the integrated circuit memory in FIG. 15 further has a ground line GL. The ground line GL is disposed above the diffusion region 1129, and connected to the field-effect transistor 1120 through the diffusion region 1129.

Referring to table 2 as shown below, it represents operations of the integrated circuit memory 1000D, 1000E of embodiments of the present disclosure. During programming, $V_{WL}$ voltage is provided to the selected word line WL, 0V voltage is provided to the unselected word line WL. $V_{BL}$ voltage is provided to the selected Bit line BL, 0V voltage is provided to the unselected Bit line BL. $V_{SR}$ voltage is provided to the selected storage line SL, 0V voltage is provided to the unselected storage line SL. 0V voltage is provided to the ground line. During reading, $V_{DD}$ voltage is applied to the selected word line WL, 0V voltage is provided to the unselected word line WL. 0.1$V_{DD}$~$V_{DD}$ voltage is applied to the selected Bit line BL 0V voltage is applied to the unselected Bit line BL. 0V voltage is applied to the selected storage line SL, 0V voltage is also applied to the unselected storage line SL. 0V voltage is applied to the ground line.

Table 2, Operation Conditions

| operation | conditions | | | | | | |
|---|---|---|---|---|---|---|---|
| | World line | | Bit Line | | Storage Line | | Ground |
| | Selected | Unselected | Selected | Unselected | Selected | Unselected | line |
| Program | $V_{WL}$ | 0 V | $V_{BL}$ | 0 V | $V_{SR}$ | 0 V | 0 V |
| Read | $V_{DD}$ | 0 V | 0.1 $V_{DD}$~$V_{DD}$ | 0 V | 0 V | 0 V | 0 V |

Figure 16:
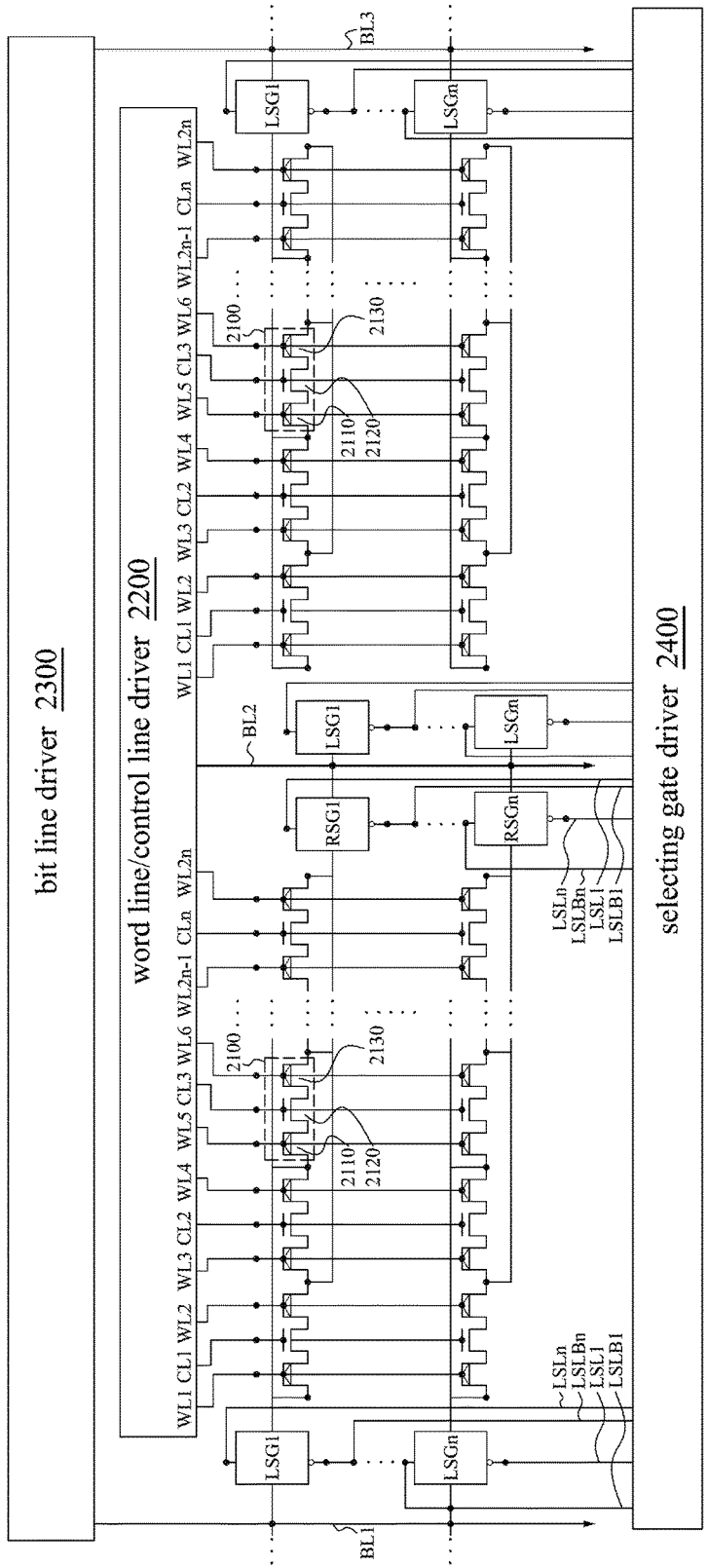
FIG. 16 is a schematic diagram of an integrated circuit memory according to embodiments of the present disclosure.

FIG. 16 is a schematic diagram of an integrated circuit memory 2000 according to embodiments of the present disclosure. The integrated circuit memory 2000 is a dielectric fuse one time programming (OTP) integrated circuit memory. The integrated circuit memory 2000 comprises plural memory pages, and each of the memory pages comprises plural memory cells 2100, a first select device LSG1 and a second select device RSG1. Each of the memory pages is connected to at least one decoding line (i.e., the word line WL, the control line CL or the Bit line BL) or at least one ground line GL (not shown in the figure), and the memory cells 2100 are connected to each other in series. Each of the memory cells 2100 comprises a first field-effect transistor 2110, a second field-effect transistor 2120 and a third field-effect transistor 2130. The field-effect transistors 2110~2130 all comprise a first region, a second region and a third region. The third region is connected to the first region and the second region. The field-effect transistors 2110~2130 further comprise a gate dielectric layer and a gate electrode layer. The gate dielectric layer is disposed on the third region and the gate electrode layer is configured to receive and apply an electric signal to the gate dielectric layer, such that the electric signal renders the conduction of the electric signal between the first region and the second region through the third region.

The second region of the first field-effect transistor 2110 is connected to or shared with the first region of the second field-effect transistor 2120, the first region of the first field-effect transistor 2110 is connected to the first select device LSG1, and the gate electrode layer of the first field-effect transistor 2110 is connected to one of the word lines WL~WL2n. The first region of the third field-effect transistor 2130 is connected to or shared with the second region of the second field-effect transistor 2120, the second region of the third field-effect transistor 2130 is connected to the second select device RSG1, and the gate electrode layer of the third field-effect transistor 2130 is connected to another one of the word line WL~WL2n. In addition, the word line/control line driver 2200 is connected to and applies the electric signal to the word lines WL~WL2n and the control lines CL~CLn. The Bit line driver 2300 is connected to and applies the electric signal to the Bit lines BL1~BL3, and the selecting gate driver 2400 is connected to and applies the electric signal to the selecting line LSL1 LSLn, LSLB1, LSLBn. The gate electrode layer of the second field-effect transistor 2120 is connected to the control lines CL1~CLn. Each of the first field-effect transistor 2110 the second field-effect transistor 2120 and the third field-effect transistor 2130 further comprises a ground terminal (not shown in the figure), and the ground terminal is connected to the ground line (not shown in the figure) of the memory cell 2100. In another embodiment, the first regions of the first field-effect transistors 2110 of two adjacent memory cells of the memory cells 2100 are connected to the first select device LSG1. In still another embodiment, the second regions of the third field-effect transistors 2130 of two adjacent memory cells of the memory cells 2100 are connected to the second select device RSG1. The first select device LSG1 and the second select device RSG1 all comprise a first terminal, a second terminal and a third terminal. The first terminal is connected to the first region of the first field-effect transistor 2110 of one of the memory cells 2100, the second terminal is connected to the Bit line BL, and the third terminal is connected to the selecting line LSL so as to render the transmission of the electric signal between the first terminal and the second terminal of the first select device LSG1 or the second select device RSG1. In another embodiment, each of the first select device LSG1 and the second select device RSG1 comprises a first terminal, a second terminal, a third terminal and a fourth terminal. The first terminal is connected to the first region of the first field-effect transistor 2110 of one of the memory cells 2100, the second terminal is connected to the Bit line BL and the third terminal and the fourth terminal are connected to the selecting line LSL so as to render the transmission of the electric signal between the first terminal and the second terminal of the first select device LSG1 or the second select device RSG1. The first select devices LSG1 or the second select devices RSG1 of two adjacent memory pages of the memory pages are connected to the Bit line BL.

In one embodiment, each of the gate dielectric layers of field-effect transistors 2110, 2120, 2130 is composed of an interfacial layer 2116/2126/2136 and a High-K dielectric layer 2115/2125/2135. The relative dielectric constant of the High-K dielectric layer 2115/2125/2135 is larger 3.9, and the thickness of the interfacial layer 2116/2126/2136 is less than or equal to 7 nanometer. In another embodiment, the gate dielectric layers of the field-effect transistors 2110, 2120, 2130 comprise silicon oxide, silicon nitride, silicon oxy-nitride, aluminum oxide, aluminum oxy-nitride or high dielectric constant (high-k) material. High-k dielectrics comprise metal oxides, including oxides of Li, Be, Mg, Ca, Sr, Sc, Y, Zr, Hf, Al, La, Ce, Pr, Nd, Sm, Eu, Gd, Tb, Dy, Ho, Er, Tm, Yb, Lu and mixtures thereof. In still another embodiment, the gate electrodes of the field-effect transistors 2110, 2120, 2130 comprise polycrystalline silicon or comprise metal selected from a group of W, Cu, Ti, Ag, Al, TiAl, TiAlN, TaC, TaCN, TaSiN, Mn, Zr, TiN, WN, TaN, and Ru or combinations thereof. In yet another embodiment, the field-effect transistors 2110, 2120, 2130 can be n type MOSFET, p type MOSFET, n type junction-less MOSFET, p type Junction-less MOSFET, n type FinFET, p type FinFET, n type trigate MOSFET, p type trigate MOSFET, n type nanowire MOSFET, or p type nanowire MOSFET.

In yet another embodiment, applying the electric signal to the word line WL, the Bit line BL and the selecting line renders the transmission of the electric signal between the first terminal and the second terminal of the first select device LSG1 and the second select device RSG1, such that a voltage difference or a current is generated at the gate dielectric layer of the first field-effect transistor 2110 or the third field-effect transistor 2130, so as to change the conductivity of the gate dielectric layer of the first field-effect transistor 2110 or the third field-effect transistor 2130 from high state to low state.

In still another embodiment, applying the electric signal to the control line CL renders the second field-effect transistor 2120 conduct, applying the electric signal to the word line WL (i.e., the word line WL6) renders the third field-effect transistor 2130 conduct, applying the electric signal around reference ground of the integrated circuit memory 2000 to the word line WL (i.e., the word line WL5), applying the electric signal to the Bit line BL1, and the intensity of the electric signal is sensed from the Bit line BL1 which is read as the state of the conductivity of the gate dielectric layer of the first field-effect transistor 2110.

In yet another embodiment applying the electric signal to the control line CL renders the second field-effect transistor 2120 conduct, applying the electric signal to the word line WL (i.e., the word line WL5) renders the first field-effect transistor 2110 conduct, applying the electric signal around reference ground of the integrated circuit memory 2000 to the WL (i.e., the word line WL6), applying the electric signal to the Bit line BL1, and the intensity of the electric signal is sensed from the Bit line BL1 which is read as the state of the conductivity of the gate dielectric layer of the third field-effect transistor 2130.

Figure 17:
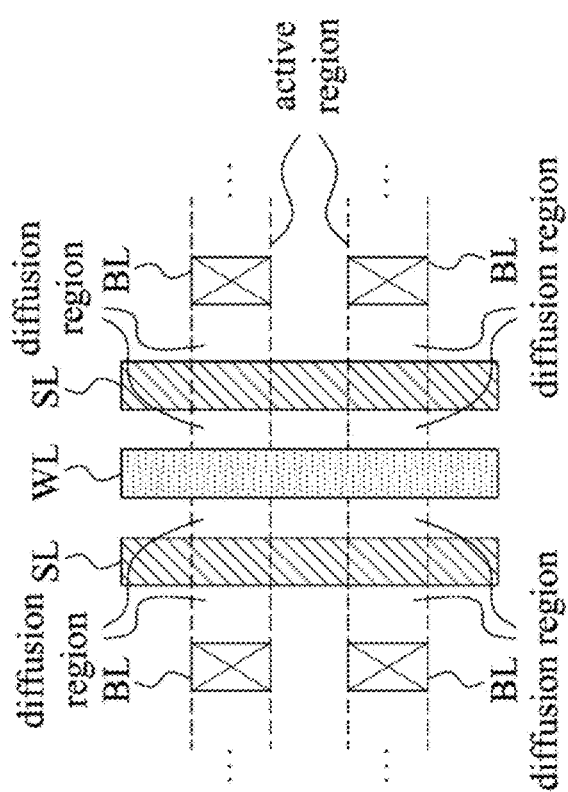
FIG. 17 is a layout of an integrated circuit memory as shown in FIG. 18 according to embodiments of the present disclosure.

FIG. 17 is a layout diagram of an integrated circuit memory 2000 as shown in FIG. 16 according to embodiments of the present disclosure. As shown in the figure, the diffusion region is within the active region. The word line WL is disposed on the diffusion region perpendicularly. The storage line SL is adjacent to the word line WL, and is disposed on the diffusion region perpendicularly. The Bit line BL is perpendicular to the diffusion region, the word line WL, and the storage line SL, and the Bit line BL is connected to the diffusion region through the via and the metal plug extended to the middle of two adjacent word lines WL.

Figure 18:
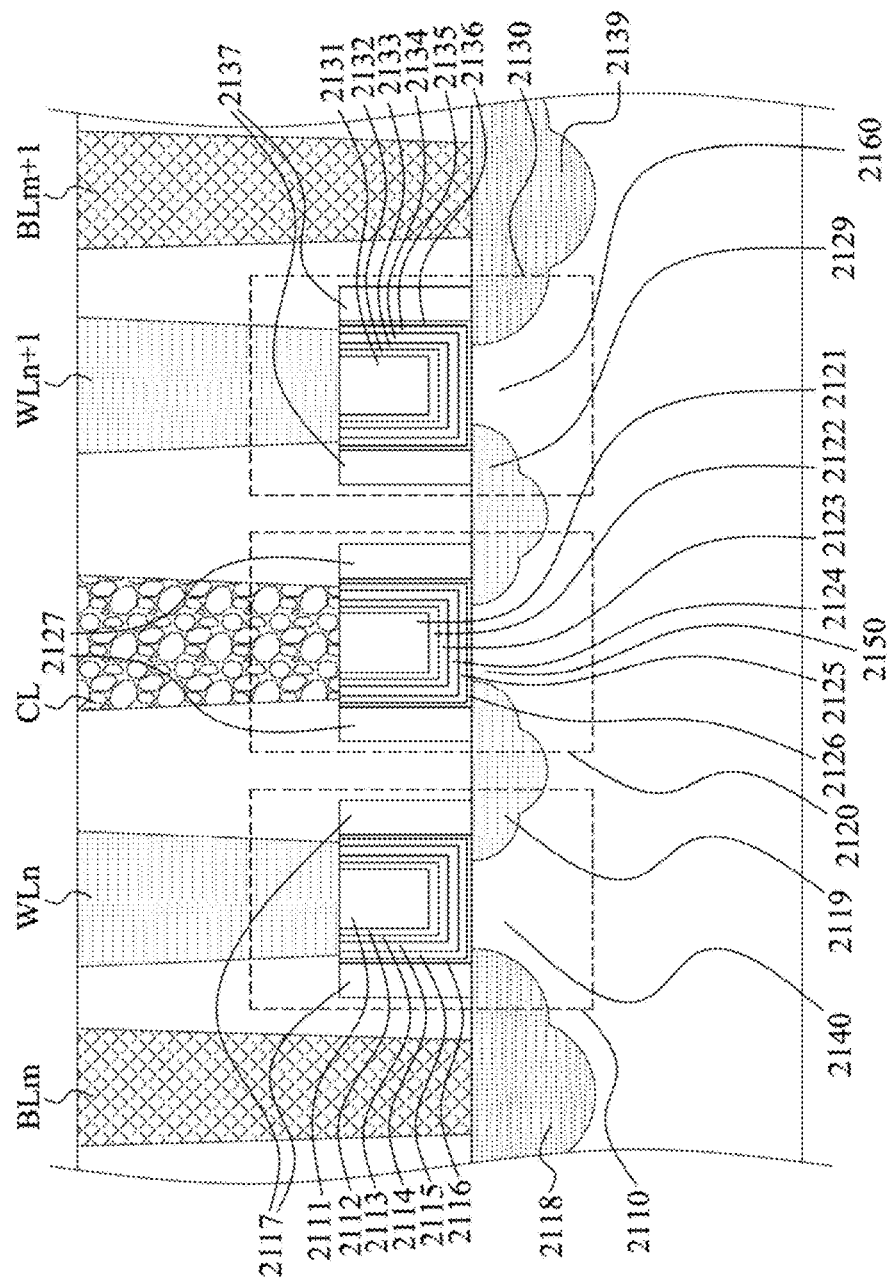
FIG. 18 is a structure diagram of an integrated circuit memory according to embodiments of the present disclosure.

FIG. 18 is a structure diagram of an integrated circuit memory according to embodiments of the present disclosure. Compared with the structure of the integrated circuit memory in FIG. 4, the integrated circuit memory in FIG. 18 is further disposed a field-effect transistor as a storing component, and further disposed a Bit line. For example, the integrated circuit memory in FIG. 20 further disposed a field-effect transistor 2110 as a storing component, the first region 2118 thereof is connected to the Bit line BLm, and the second region 2119 thereof is connected to or shared with the first region of the field-effect transistor 2120 which is used as a control component. In addition, the second region of the field-effect transistor 2120 which is used as a control component is connected to or shared with the first region of the field-effect transistor 2130 which is used as a storing component, and the second region of the transistor 130 is connected to the Bit line BLm+1.

Referring to table 3 as shown below, it represents an operation of the integrated circuit memory 2000 of embodiments of the present disclosure During programming, $V_{WL}$ voltage is provided to the selected word line WL, and 0V voltage is provided to a word line WL which is adjacent to the selected word line WL. 0V voltage is provided to the unselected word line WL, or the unselected word line WL is floating. 0V voltage is provided to the selected control line CL, or the selected control line CL is floating. 0V voltage is provided to the unselected control line CL. $V_{BL}$ voltage is provided to the selected beat line BL. 0V voltage is provided to a Bit line BL which is adjacent to the selected Bit line BL, or the foregoing Bit line BL is floating. 0V voltage is provided to the unselected Bit line BL. $V_{SR}$ voltage is provided to the selected storage line SL, 0V voltage is provided to the unselected storage line SL. If there is a ground line, 0V voltage is provided to the ground line. During reading, 0V voltage is provided to the selected word line WL, and $V_{DD}$ voltage is provided to a word line WL which is adjacent to the selected word line WL. 0V voltage is provided to the unselected word line WL, or the unselected word line WL is floating. $V_{DD}$ voltage is provided to the selected control line CL, and 0V voltage is provided to the unselected control line CL. $0.1V_{DD}$~$V_{DD}$ voltage is provided to the selected Bit line BL, and 0V voltage is provided to a Bit line BL which is adjacent to the selected Bit line BL. 0V voltage is provided to the unselected Bit line BL. $V_{DD}$ voltage is provided to the selected storage line SL, 0V voltage is provided to the unselected storage line SL. If there is a ground line, 0V voltage is provided to the ground line.

Table 3, Operation Conditions

| | World line | | | Control line | | Bit Line | | | Storage Line | | |
|---|---|---|---|---|---|---|---|---|---|---|---|
| operation | Selected, n | Neighborhood, n + 1 or n − 1 | Unselected | Selected | Unselected | Selected | Neighborhood, n + 1 or n − 1 | Unselected | Selected | Unselected | Ground (optional) |
| Program | $V_{WL}$ | 0 V | 0 V or floating | 0 V or floating | 0 V | $V_{BL}$ | 0 V or floating | 0 V | $V_{SR}$ | 0 V | 0 V |
| Read | 0 V | $V_{DD}$ | 0 V or floating | VDD | 0 V | $0.1 V_{DD}$~$V_{DD}$ | 0 V | 0 V | $V_{DD}$ | 0 V | 0 V |

In view of the above embodiments of the present disclosure, it is apparent that the application of the present disclosure has the advantages as follows:

1. Compared with the traditional fuse-type wire memory, the integrated circuit memory of the present disclosure merely needs extremely low operating current, lower area per unit memory, and read/write ability of the integrated circuit memory of the present disclosure is stable;

2. Compared with dielectric anti-fuse type memory, the integrated circuit memory of the present disclosure has a stable operation margin, excellent data retention, lower area per unit memory, lower noise, lower electrical disturbance, and lower dynamic power consumption;

3. Compared with traditional charge storage memory, the manufacturing process of the integrated circuit memory of the present disclosure is simple, additional photomask does not need in such manufacturing process, data retention is better, and the manufacturing cost is low.

Although the present disclosure has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present disclosure without departing from the scope or spirit of the disclosure. In view of the foregoing, it is intended that the present disclosure cover modifications and variations of this disclosure provided they fall within the scope of the following claims.

What is claimed is:

1. An integrated circuit memory, comprising:
   plural memory cells, wherein each of the memory cells is connected to at least one decoding line or at least one ground line, and each of the memory cells comprises:
      a first field-effect transistor, comprising:
         a first region, a second region and a third region, wherein the third region is connected to the first region and the second region;
         at least one gate dielectric layer being disposed on the third region; and
         at least one gate electrode layer being configured to receive and apply a first electric signal to the gate dielectric layer, such that the first electric signal renders the conduction of an electric signal between the first region and the second region through the third region; and
      a second field-effect transistor, comprising:

a first region, a second region and a third region, wherein the third region is connected to the first region and the second region;

at least one gate dielectric layer being disposed on the third region; and at least one gate electrode layer being configured to receive and apply a second electric signal to the gate dielectric layer;

wherein applying the second electric signal to the gate dielectric layer of the second field-effect transistor renders the conductivity of the gate dielectric layer from high state to low state, and the conductivity of the gate dielectric layer is not changed by applying the second electric signal to the gate dielectric layer of the second field-effect transistor again, wherein the high state and the low state of the gate dielectric layer respectively represent two different storing states of the memory cell, wherein the second electric signal is larger than a hard breakdown voltage of the second field-effect transistor.

2. The integrated circuit memory of claim 1, wherein at least one gate electrode layer of the second field-effect transistor is connected to a first decoding line, and the first region of the second field-effect transistor is connected to or shared with the second region of the first field-effect transistor.

3. The integrated circuit memory of claim 2, wherein the second region of the second field-effect transistor is connected to a fourth decoding line.

4. The integrated circuit memory of claim 2, wherein the gate electrode layer of the first field-effect transistor is connected to a second decoding line, and the first region of the first field-effect transistor is connected to a third decoding line, wherein each of the first field-effect transistor and the second field-effect transistor comprises a ground terminal, and the ground terminal is connected to the ground line of the memory cell.

5. The integrated circuit memory of claim 4, wherein the first field-effect transistors of two adjacent memory cells of the memory cells are connected to the third decoding line.

6. The integrated circuit memory of claim 1, wherein when the gate dielectric layer of the second field-effect transistor comprises one dielectric layer, the relative permittivity of the dielectric layer is less than or equal to 10; when the gate dielectric layer of the second field-effect transistor comprises plural dielectric layers, the relative permittivity of one of the dielectric layers is less than or equal to 10, and the relative permittivities of the other the dielectric layers are larger than the relative permittivities of the one dielectric layer.

7. The integrated circuit memory of claim 5, wherein applying decoding electric signals to the first decoding line, the second decoding line and the third decoding line renders the first field-effect transistor of one of the memory cells conductive, such that a voltage difference or a current is generated at two terminals of a gate oxide layer of the second field-effect transistor, so as to change the conductivity of the gate dielectric layer of the second field-effect transistor from high state to low state for storing information.

8. The integrated circuit memory of claim 7, wherein applying the decoding electric signals to the first decoding line, the second decoding line and the third decoding line renders the first field-effect transistor of one of the memory cells conductive, and the intensity of the decoding electric signals is sensed from the first decoding line or the third decoding line which is read as the state of the conductivity of the gate dielectric layer of the second field-effect transistor.

9. The integrated circuit memory of claim 5, wherein applying decoding electric signals to the first decoding line and a fourth decoding line renders a voltage difference is generated at two terminals of the gate dielectric layer of the second field-effect transistor, so as to change the conductivity of the gate dielectric layer of the second field-effect transistor from high state to low state, the conductivity of the gate dielectric layer of the second field-effect transistor is therefore changed for storing information.

10. The integrated circuit memory of claim 9, wherein applying the decoding electric signals to the second decoding line and the third decoding line renders the first field-effect transistor of one of the memory cells conductive, applying the decoding electric signals around reference ground to the first decoding line and the fourth decoding line, and the intensity of the decoding electric signals is sensed from the third decoding line or the fourth decoding line which is read as the state of the conductivity of the gate dielectric layer of the second field-effect transistor.

11. An integrated circuit memory, comprising:
plural memory cells, wherein each of the memory cells is connected to at least one decoding line or at least one ground line, and each of the memory cells comprises:
a field-effect transistor, comprising:
a first region, a second region and a third region, wherein the third region is connected to the first region and the second region;
at least one gate dielectric layer being disposed on the third region; and
at least one gate electrode layer being configured to receive and apply a first electric signal to the gate dielectric layer, such that the first electric signal renders the conduction of an electric signal between the first region and the second region through the third region; and
a storing component, comprising:
at least one dielectric layer, applying the second electric signal to at least one dielectric layer of the storing component renders the conductivity of the at least one dielectric layer from high state to low state for writing information into the storing component, wherein the conductivity of the at least one dielectric layer is not changed by applying the second electric signal to the at least one dielectric layer of the storing component again, wherein the high state and the low state of the dielectric layer respectively represent two different storing states of the memory cell,
wherein the second electric signal is larger than a hard breakdown voltage of the storing component.

12. The integrated circuit memory of claim 11, wherein the storing component further comprises:
a first layer portion, wherein the at least one dielectric layer of the storing component is disposed on the first layer portion; and
a second layer portion being disposed on the at least one dielectric layer;
wherein the first layer portion is a first electrode or a first interconnect, and the second layer portion is a second electrode or a second interconnect.

13. The integrated circuit memory of claim 12, wherein the first electrode, the second electrode, the first interconnect and the second interconnect are selected from the group consisting of metal nitride, metal silicide, metal polycrystalline silicide and a combination thereof.

14. The integrated circuit memory of claim 11, wherein a first terminal of the storing component is connected to a first decoding line, and a second terminal of the storing component is connected to the second region of the field-effect transistor.

15. The integrated circuit memory of claim 14, wherein the gate electrode layer of the field-effect transistor is connected to a second decoding line, the first region of the field-effect transistor is connected to a third decoding line, the field-effect transistor further comprises a ground terminal, and the ground terminal is connected to the ground line of the memory cell.

16. The integrated circuit memory of claim 15, wherein the field-effect transistors of two adjacent memory cells of the memory cells are connected to the third decoding line.

17. The integrated circuit memory of claim 11, wherein when the storing component comprises one dielectric layer, the relative permittivity of the dielectric layer is less than or equal to 10 and the thickness of the dielectric layer is less than or equal to 3 nanometers; when the storing component comprises plural dielectric layers, the relative permittivity of one of the dielectric layers is less than or equal to 10, and each of the relative permittivities of the other dielectric layers is larger than the relative permittivities of the one dielectric layer.

18. The integrated circuit memory of claim 15, wherein applying the decoding electric signal to the first decoding line, the second decoding line and the third decoding line renders the field-effect transistor of one of the memory cells conductive, such that a voltage difference or a current is generated at two terminals of the storing component, so as to change the conductivity of the at least one dielectric of the storing component from high state to low state, the conductivity of the storing component is therefore changed for storing information.

19. The integrated circuit memory of claim 18, wherein applying the decoding electric signal to the first decoding line, the second decoding line and the third decoding line renders the field-effect transistor of one of the memory cells conductive, and the intensity of the decoding electric signal is sensed from the first decoding line or the third decoding line which is read as high state or low state of the conductivity of the storing component.

20. An integrated circuit memory, comprising:
plural memory pages, wherein each of the memory pages comprises plural memory cells, a first select device and a second select device, wherein each of the memory pages is connected to at least one decoding line or at least one ground line, the memory cells is connected to each other in series, and each of the memory cells comprises:
a first field-effect transistor, comprising:
a first region, a second region and a third region, wherein the third region is connected to the first region and the second region;
at least one gate dielectric layer being disposed on the third region; and
at least one gate electrode layer being configured to receive and apply a first electric signal to the gate dielectric layer, such that the first electric signal renders the conduction of the electric signal between the first region and the second region through the third region;
a second field-effect transistor, comprising:
a first region, a second region and a third region, wherein the third region is connected to the first region and the second region;
at least one gate dielectric layer being disposed on the third region; and
at least one gate electrode layer being configured to receive and apply a second electric signal to the gate dielectric layer, such that the second electric signal renders the conduction of the electric signal between the first region and the second region through the third region; and
a third field-effect transistor, comprising:
a first region, a second region and a third region, wherein the third region is connected to the first region and the second region;
at least one gate dielectric layer being disposed on the third region; and
at least one gate electrode layer being configured to receive and apply a third electric signal to the gate dielectric layer, such that the third electric signal renders the conduction of the electric signal between the first region and the second region through the third region;
wherein the second region of the first field-effect transistor is connected to or shared with the first region of the second field-effect transistor, the first region of the first field-effect transistor is connected to the first select device, and the at least one gate electrode layer of the first field-effect transistor is connected to a first decoding wire of a first decoding line;
wherein the first region of the third field-effect transistor is connected to or shared with the second region of the second field-effect transistor, the second region of the third field-effect transistor is connected to the second select device, and the at least one gate electrode layer of the third field-effect transistor is connected to a second decoding wire of the first decoding line;
wherein applying the first electric signal to the gate dielectric layer of the first field-effect transistor or applying the third electric signal to the gate dielectric layer of the third field-effect transistor renders the conductivity of the gate dielectric layer of the first field-effect transistor or the third field-effect transistor from high state to low state, and the conductivity of the gate dielectric layer is not changed by applying the first electric signal to the gate dielectric layer of the first field-effect transistor or applying the third electric signal to the gate dielectric layer of the third field-effect transistor again, wherein the high state and the low state of the gate dielectric layer respectively represent two different storing states of the memory cell.

21. The integrated circuit memory of claim 20, wherein at least one gate electrode layer of the second field-effect transistor is connected to a second decoding line, wherein each of the first field-effect transistor, the second field-effect transistor and the third field-effect transistor further comprises a ground terminal, and the ground terminal is connected to the ground line of the memory cell.

22. The integrated circuit memory of claim 21, wherein the first regions of the first field-effect transistors of two adjacent memory cells of the memory cells are connected to the first select device.

23. The integrated circuit memory of claim 20, wherein when each of the gate dielectric layers of the first field-effect transistor and the third field-effect transistor comprises one dielectric layer, the relative permittivity of the dielectric layer is less than or equal to 10 and the thickness of the dielectric layer is less than or equal to 3 nanometers; when each of the gate dielectric layers of the first field-effect transistor and the third field-effect transistor comprises plural dielectric layers, the relative permitivities of one of the dielectric layers is less than or equal to 10, and each of the relative permitivities of the other dielectric layers is larger than the relative permittivity of the one dielectric layer.

24. The integrated circuit memory of claim 22, wherein the second regions of the third field-effect transistors of two adjacent memory cells of the memory cells are connected to the second select device.

25. The integrated circuit memory of claim 21, wherein each of the first select device and the second select device comprises a first terminal, a second terminal and a third terminal, wherein the first terminals of the first select device and the second select device are connected to the first region of the first field-effect transistor of one of the memory cells, the second terminals of the first select device and the second select device are connected to a third decoding line, and the third terminals of the first select device and the second select device are connected to a fourth decoding line so as to render the transmission of an electric signal between the first terminal and the second terminal of the first select device.

26. The integrated circuit memory of claim 21, wherein each of the first select device and the second select device comprises a first terminal, a second terminal, a third terminal and a fourth terminal, wherein the first terminals of the first select device and the second select device are connected to the first region of the first field-effect transistor of one of the memory cells, the second terminals of the first select device and the second select device are connected to a third decoding line, and the third terminals and the fourth terminals of the first select device and the second select device are connected to a fourth decoding line so as to render the transmission of an electric signal between the first terminal and the second terminal of the first select device.

27. The integrated circuit memory of claim 25, wherein the first select devices or the second select devices of two adjacent memory pages of the memory pages are connected to the third decoding line.

28. An operation method of an integrated circuit memory, applied in the integrated circuit memory according to claim 25, the operation method comprising:
 applying decoding electric signals to the first decoding line, the third decoding line and the fourth decoding line respectively renders the transmission of an electric signal between the first terminal and the second terminal of the first select device and the second select device, such that a voltage difference or a current is generated at the gate dielectric layer of the first field-effect transistor or the third field-effect transistor, so as to change the conductivity of the gate dielectric layer of the first field-effect transistor or the third field-effect transistor from high state to low state.

29. The operation method of claim 28, further comprising:
 applying a first decoding electric signal to the second decoding line to render the second field-effect transistor conductive;
 applying a second decoding electric signal to the second decoding wire of the first decoding line to render the third field-effect transistor conductive;
 applying a third decoding electric signal around reference ground of the integrated circuit memory to the first decoding wire of the first decoding line; and
 applying a fourth electric signal to the third decoding line, and an electric signal intensity is sensed from the third decoding line which is read as the state of the conductivity of the gate dielectric layer of the first field-effect transistor.

30. The operation method of claim 28, further comprising:
 applying a first decoding electric signal to the second decoding line to render the second field-effect transistor conduct;
 applying a second decoding electric signal to the first decoding wire of the first decoding line to render the first field-effect transistor conductive;
 applying a third decoding electric signal around reference ground of the integrated circuit memory to the second decoding wire of the first decoding line; and
 applying a fourth decoding electric signal to the third decoding line, and an electric signal intensity is sensed from the third decoding line which is read as the state of the conductivity of the gate dielectric layer of the third field-effect transistor.

* * * * *